(12) United States Patent (10) Patent No.: US 9,302,213 B2
Manahan et al. (45) Date of Patent: *Apr. 5, 2016

(54) PRE-FILTRATION AND MAINTENANCE SENSING FOR EXPLOSION-PROOF ENCLOSURES

(71) Applicant: Cooper Technologies Company, Houston, TX (US)

(72) Inventors: Joseph Michael Manahan, Manlius, NY (US); Graig E. DeCarr, Cicero, NY (US)

(73) Assignee: Cooper Technologies Company, Houston, TX (US)

( * ) Notice: Subject to any disclaimer, the term of this patent is extended or adjusted under 35 U.S.C. 154(b) by 207 days.

This patent is subject to a terminal disclaimer.

(21) Appl. No.: 14/024,313

(22) Filed: Sep. 11, 2013

(65) Prior Publication Data

US 2014/0013940 A1 Jan. 16, 2014

Related U.S. Application Data

(62) Division of application No. 13/331,270, filed on Dec. 20, 2011, now Pat. No. 8,821,622.

(51) Int. Cl.
*B01D 46/10* (2006.01)
*B01D 46/46* (2006.01)
*H05K 7/20* (2006.01)

(52) U.S. Cl.
CPC ............ *B01D 46/46* (2013.01); *H05K 7/20181* (2013.01)

(58) Field of Classification Search
USPC ............ 55/283, 293, 300, 302, 385.4, 385.7, 55/482; 96/417, 420, 421, 422
See application file for complete search history.

(56) References Cited

U.S. PATENT DOCUMENTS

| 2,801,768 A | 8/1957 | Immel |
| 3,001,606 A | 9/1961 | Bierwirth et al. |
| 4,229,306 A | 10/1980 | Hein et al. |
| 4,328,901 A | 5/1982 | Gunderman et al. |
| 4,484,690 A | 11/1984 | Nash |
| 4,732,675 A | 3/1988 | Badolato et al. |
| 4,787,923 A * | 11/1988 | Fleigle et al. .................. 55/304 |
| 5,145,496 A * | 9/1992 | Mellen ............................ 55/337 |
| RE34,308 E | 7/1993 | Thompson et al. |
| 5,421,862 A | 6/1995 | Davis |
| 5,741,351 A | 4/1998 | Beal et al. |
| 5,810,908 A * | 9/1998 | Gray et al. ........................ 95/25 |
| 6,217,638 B1 | 4/2001 | Van de Velde |
| 6,331,674 B1 | 12/2001 | Zolock et al. |

(Continued)

FOREIGN PATENT DOCUMENTS

| DE | 19904981 | 8/2000 |
| JP | 7068114 | 3/1995 |

(Continued)

*Primary Examiner* — Duane Smith
*Assistant Examiner* — Minh-Chau Pham
(74) *Attorney, Agent, or Firm* — King & Spalding LLP

(57) ABSTRACT

A filter system for an explosion-proof enclosure is described herein. The filter system can include a pre-filter assembly located outside the explosion-proof enclosure. The pre-filter assembly can include a pre-filter material configured to control air passing therethrough. The filter system can also include a filter assembly coupled to the pre-filter assembly. The filter assembly can further control the air received from the pre-filter assembly and passing therethrough into the explosion-proof enclosure.

20 Claims, 14 Drawing Sheets

(56) References Cited

U.S. PATENT DOCUMENTS

| | | |
|---|---|---|
| 6,383,241 B1 | 5/2002 | Janus et al. |
| 6,440,190 B1 | 8/2002 | Goyetche |
| 6,447,565 B1 | 9/2002 | Raszkowski et al. |
| 6,527,837 B2 | 3/2003 | Kurosawa et al. |
| 6,646,867 B1 | 11/2003 | Tuttle et al. |
| 6,660,070 B2 * | 12/2003 | Chung et al. ............... 96/424 |
| 6,708,834 B2 | 3/2004 | Hagerman, III |
| 6,793,703 B1 | 9/2004 | Sledge et al. |
| 6,817,940 B2 | 11/2004 | Pfannenberg |
| 6,852,141 B2 | 2/2005 | Bishop et al. |
| 6,882,523 B2 | 4/2005 | Turner et al. |
| 7,323,025 B2 | 1/2008 | Weidner |
| 7,413,089 B1 | 8/2008 | Tidwell |
| 7,625,277 B2 | 12/2009 | Palmer |
| 7,819,935 B2 | 10/2010 | Austin et al. |
| 7,896,165 B2 * | 3/2011 | Hakola ..................... 209/715 |
| 7,931,725 B2 | 4/2011 | Wydeven et al. |
| 7,959,701 B2 | 6/2011 | Merritt |
| 8,062,403 B2 | 11/2011 | Goode |
| 8,087,980 B2 | 1/2012 | Palmer |
| 8,172,920 B2 | 5/2012 | Merritt |
| 8,246,707 B2 | 8/2012 | Xu et al. |
| 8,821,622 B2 * | 9/2014 | Manahan et al. ............... 96/417 |
| 2003/0079448 A1 | 5/2003 | How et al. |
| 2003/0097935 A1 | 5/2003 | Burkhart |
| 2003/0126843 A1 | 7/2003 | Hsu |
| 2005/0013711 A1 | 1/2005 | Goyetche |
| 2005/0160911 A1 | 7/2005 | Friday et al. |
| 2006/0169145 A1 * | 8/2006 | Chan ........................... 96/227 |
| 2007/0193236 A1 | 8/2007 | Merritt |
| 2008/0053906 A1 | 3/2008 | Kawai et al. |
| 2009/0165651 A1 | 7/2009 | Burgess et al. |
| 2009/0211451 A1 * | 8/2009 | Hauville ..................... 95/286 |
| 2009/0284381 A1 | 11/2009 | Manahan |
| 2010/0148643 A1 | 6/2010 | Fauveau |
| 2010/0258331 A1 | 10/2010 | Dahlgren et al. |
| 2010/0284150 A1 | 11/2010 | Manahan et al. |
| 2011/0197767 A1 | 8/2011 | Seitz |
| 2011/0308213 A1 | 12/2011 | Gillispie et al. |
| 2012/0160105 A1 | 6/2012 | Manahan et al. |

FOREIGN PATENT DOCUMENTS

| | | |
|---|---|---|
| JP | 7068114 | 7/1995 |
| JP | 2003294285 | 10/2003 |

* cited by examiner

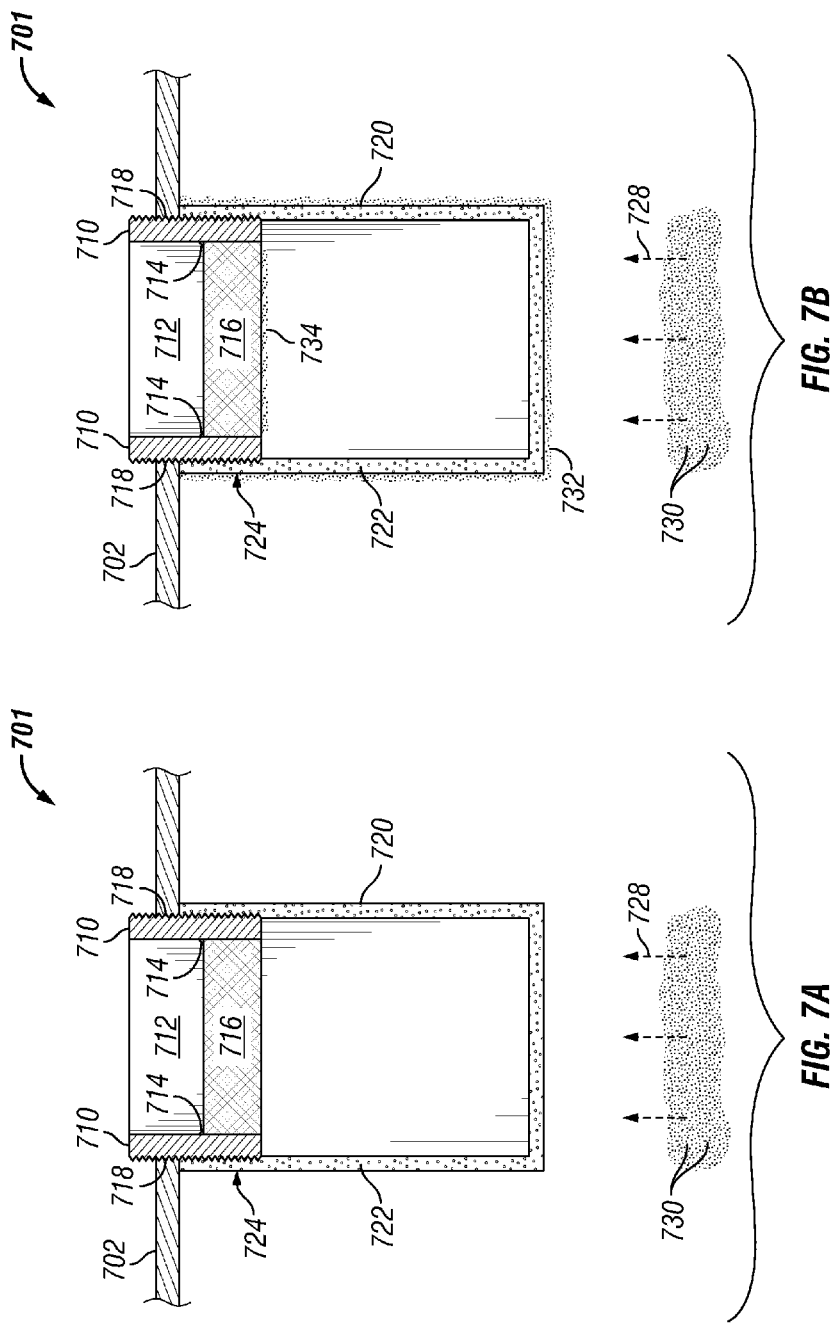

PRE-FILTRATION AND MAINTENANCE SENSING FOR EXPLOSION-PROOF ENCLOSURES

CROSS-REFERENCE TO RELATED APPLICATIONS

This application is a divisional application of and claims priority to U.S. patent application Ser. No. 13/331,270, titled "Pre-Filtration and Maintenance Sensing for Explosion-Proof Enclosures," filed on Dec. 20, 2011, now U.S. Pat. No. 8,821,622, which claims priority under 35 U.S.C. §119 to U.S. Provisional Patent Application Ser. No. 61/426,413, titled "Sintered Filters having Pre-Filtration and Maintenance Sensing" and filed on Dec. 22, 2010. The entire contents of each of the foregoing applications are hereby incorporated herein by reference.

The present application also is related to U.S. patent application Ser. No. 13/331,724, titled "Structural Reinforcements For Filter Assemblies," filed on Dec. 20, 2011, in the names of Joseph Michael Manahan and Graig E. DeCarr, the entire contents of which are hereby incorporated herein by reference.

TECHNICAL FIELD

The present disclosure relates generally to filter assemblies and maintenance sensing, and more particularly to systems, methods, and devices for pre-filtration of air passing into an explosion-proof enclosure and sensing when maintenance, based on measurements within an explosion-proof enclosure, is needed.

BACKGROUND

Explosion-proof receptacle housings and enclosure systems are used in many different industrial applications. Such explosion-proof receptacle housing and enclosure systems may be used, for example, in military applications, onboard ships, assembly plants, power plants, oil refineries, petrochemical plants, and other harsh environments. At times, the equipment located inside such explosion-proof receptacle housing and enclosure systems is used to control motors and other industrial equipment.

Traditional motor starters and related equipment fail to provide adequate torque control and result in excessive wear on the motor and associated equipment. Instead, variable frequency drives (VFDs) are often used in place of traditional motor starters. However, VFDs tend to generate heat and are subject to failure when exposed to excessive temperatures caused by the heat loss. A common practice to reduce heat-related problems is to remove the VFD to a remote location so that an explosion-proof receptacle housing and enclosure system is not required, allowing proper cooling of the VFD during operation. However, installation costs may increase and operational problems may result from increased line losses from the added distance that signals between the VFD and the related equipment must travel.

SUMMARY

In general, in one aspect, the disclosure relates to a filter system for an explosion-proof enclosure. The filter system can include a pre-filter assembly located outside the explosion-proof enclosure. The pre-filter assembly can include a pre-filter material configured to control air passing therethrough. The filter system can also include a filter assembly coupled to the pre-filter assembly. The filter assembly can further control the air received from the pre-filter assembly and passing therethrough into the explosion-proof enclosure.

In another aspect, the disclosure can generally relate to a maintenance sensing system for an explosion-proof enclosure. The maintenance sensing system can include a filter system located in an aperture of the explosion-proof enclosure. The filter system can control air flowing into the explosion-proof enclosure. The maintenance sensing system can also include a sensor that can measure an operating value of an operating parameter inside the explosion-proof enclosure, where the operating value is associated with the air flowing into the explosion-proof enclosure through the filter system. The maintenance sensing system can further include a control device operatively coupled to the sensor. The control device can receive the operating value from the sensor, determine that the operating value exceeds a threshold value, and perform, based on determining that the operating value exceeds a threshold value, a maintenance operation to reduce the operating value of the operating parameter inside the explosion-proof enclosure.

In yet another aspect, the disclosure can generally relate to a method for controlling air flowing into an explosion-proof enclosure. The method can include passing the air through a pre-filter assembly to control the air, where the pre-filter assembly includes a pre-filter material and is located outside the explosion-proof enclosure. The method can further include passing, after passing the air through the pre-filter assembly, the air through a filter assembly to the explosion-proof enclosure, where the filter assembly further controls the air and is coupled to the pre-filter assembly.

In yet another aspect, the disclosure can generally relate to a method for sensing when maintenance for an explosion-proof enclosure is required. The method can include receiving, from a sensor, an operating value of an operating parameter inside the explosion-proof enclosure, where the operating value is associated with air flowing through a filter system into the explosion-proof enclosure. The method can also include determining that the operating value exceeds a threshold value. The method can further include performing, based on determining that the operating value exceeds a threshold value, a maintenance operation to reduce the operating value of the operating parameter.

In yet another aspect, the disclosure can generally relate to a computer readable medium that includes computer readable program code embodied therein for performing a method for sensing when maintenance of a filter system for an explosion-proof enclosure is due. The method performed by the computer readable program code of the computer readable medium can include receiving, from a sensor, an operating value of an operating parameter inside the explosion-proof enclosure, where the operating value is associated with the air flowing through the filter system into the explosion-proof enclosure. The method performed by the computer readable program code of the computer readable medium can also include determining that the operating value exceeds a threshold value. The method performed by the computer readable program code of the computer readable medium can further include sending, based on determining that the operating value exceeds a threshold value, an alert that the maintenance of the filter system is due.

These and other aspects, objects, features, and embodiments of the present invention will be apparent from the following description and the appended claims.

BRIEF DESCRIPTION OF THE DRAWINGS

The drawings illustrate only exemplary embodiments of pre-filtration and maintenance sensing for explosion-proof enclosures and are therefore not to be considered limiting of its scope, as the invention may admit to other equally effective embodiments. The elements and features shown in the drawings are not necessarily to scale, emphasis instead being placed upon clearly illustrating the principles of the exemplary embodiments. Additionally, certain dimensions or positionings may be exaggerated to help visually convey such principles. In the drawings, reference numerals designate like or corresponding, but not necessarily identical, elements.

FIGS. 7A and 7B show an example of a filter system in accordance with one or more exemplary embodiments.

DETAILED DESCRIPTION

Figure 1:
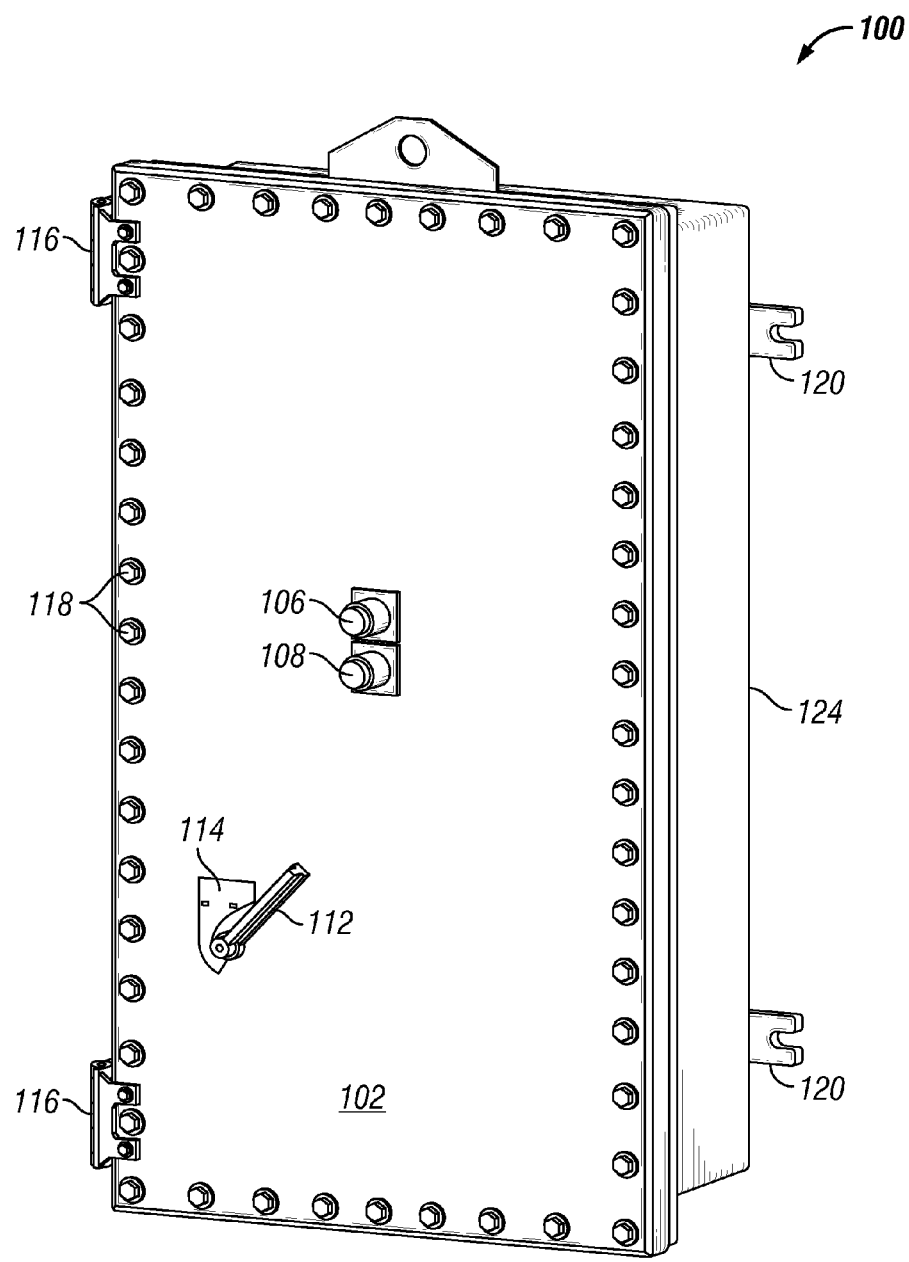
FIGS. 1 and 2 show explosion-proof enclosures in which one or more exemplary embodiments of pre-filtration and maintenance sensing may be implemented.

Exemplary embodiments of pre-filtration and maintenance sensing for explosion-proof enclosures will now be described in detail with reference to the accompanying figures. Like elements in the various figures are denoted by like reference numerals for consistency.

In the following detailed description of embodiments of pre-filtration and maintenance sensing for explosion-proof enclosures, numerous specific details are set forth in order to provide a more thorough understanding of pre-filtration and maintenance sensing for explosion-proof enclosures. However, it will be apparent to one of ordinary skill in the art that pre-filtration and maintenance sensing for explosion-proof enclosures may be practiced without these specific details. In other instances, well-known features have not been described in detail to avoid unnecessarily complicating the description. Further, certain descriptions (e.g., top, bottom, side, end, interior, inside) are merely intended to help clarify aspects of pre-filtration and maintenance sensing for explosion-proof enclosures and are not meant to limit embodiments of pre-filtration and maintenance sensing for explosion-proof enclosures.

In general, embodiments of pre-filtration and maintenance sensing for explosion-proof enclosures provide systems, methods, and devices for pre-filtration of air passing into an explosion-proof enclosure and sensing when maintenance, based on measurements within an explosion-proof enclosure, is needed. Specifically, embodiments of pre-filtration and maintenance sensing for explosion-proof enclosures provide for controlling air passing through a pre-filter assembly coupled to an explosion-proof enclosure. A pre-filter assembly may be used to control air about to pass into the explosion-proof enclosure. Further, embodiments of pre-filtration and maintenance sensing for explosion-proof enclosures provide for one or more sensors that measure an operating value for each of one or more operating parameters inside the explosion-proof enclosure, where each operating value is used to determine whether maintenance of equipment associated with the explosion-proof enclosure is needed.

While the exemplary embodiments discussed herein are with reference to explosion-proof enclosures, other types of non-explosion-proof enclosures (e.g., junction boxes, control panels, lighting panels, motor control centers, switchgear cabinets, relay cabinets) or any other type of enclosure may be used in conjunction with embodiments of pre-filtration and maintenance sensing.

A user may be any person that interacts with the explosion-proof enclosure or equipment controlled by one or more components of the explosion-proof enclosure. Examples of a user may include, but are not limited to, an engineer, an electrician, an instrumentation and controls technician, a mechanic, an operator, a consultant, a contractor, and a manufacturer's representative.

Further, an element associated with, and/or located within, an explosion-proof enclosure may be any device, sensor, wiring, terminal, switch, handle, indicating light, duct, VFD, or other component that is located within the explosion-proof enclosure, adjacent to the explosion-proof enclosure, or attached to the explosion-proof enclosure.

In one or more exemplary embodiments, an explosion-proof enclosure (also known as a flame-proof enclosure) is an enclosure that is configured to contain an explosion that originates inside the enclosure. Further, the explosion-proof enclosure is configured to allow gases from inside the enclosure to escape across joints of the enclosure and cool as the gases exit the explosion-proof enclosure. The joints are also known as flame paths and exist where two surfaces meet and provide a path, from inside the explosion-proof enclosure to outside the explosion-proof enclosure, along which one or more gases may travel. A joint may be a mating of any two or more surfaces. Each surface may be any type of surface, including but not limited to a flat surface, a threaded surface, and a serrated surface.

In one or more exemplary embodiments, an explosion-proof enclosure is subject to meeting certain standards and/or requirements. For example, the NEMA sets standards by which an enclosure must comply in order to qualify as an explosion-proof enclosure. Specifically, NEMA Type 7, Type 8, Type 9, and Type 10 enclosures set standards by which an explosion-proof enclosure within a hazardous location must comply. For example, a NEMA Type 7 standard applies to enclosures constructed for indoor use in certain hazardous locations. Hazardous locations may be defined by one or more of a number of authorities, including but not limited to the National Electric Code (e.g., Class 1, Division I) and Underwriters' Laboratories, Inc. (UL) (e.g., UL 698). For example, a Class 1 hazardous area under the National Electric Code is an area in which flammable gases or vapors may be present in the air in sufficient quantities to be explosive.

As a specific example, NEMA standards for an explosion-proof enclosure of a certain size or range of sizes may require that in a Group B, Division 1 area, any flame path of an explosion-proof enclosure must be at least 1 inch long (continuous and without interruption), and the gap between the surfaces cannot exceed 0.0015 inches. Standards created and maintained by NEMA may be found at www.nema.org/stds and are hereby incorporated by reference.

Figure 2:
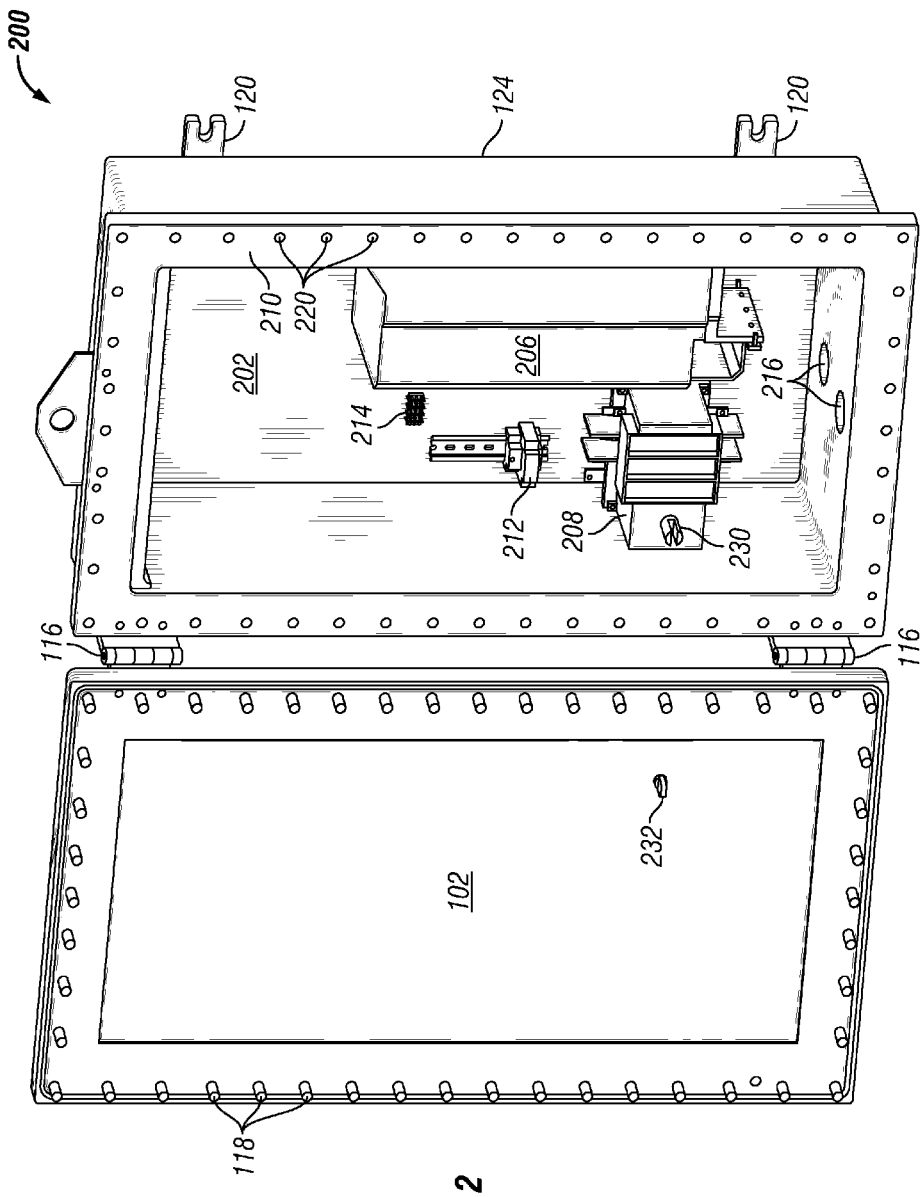

FIGS. 1 and 2 depict an explosion-proof enclosure 100 in which one or more exemplary embodiments of pre-filtration and maintenance sensing for explosion-proof enclosures may be implemented. In one or more embodiments, one or more of the components shown in FIGS. 1 and 2 may be omitted, repeated, and/or substituted. Accordingly, embodiments of an explosion-proof enclosure should not be considered limited to the specific arrangements of components shown in FIGS. 1 and 2.

Referring now to FIG. 1, an example of an explosion-proof enclosure 100 in a closed position is shown. The enclosure cover 102 is secured to the enclosure body 124 by a number of fastening devices 118 located at a number of points around the perimeter of the enclosure cover 102. In one or more embodiments, a fastening device 118 may be one or more of a number of fastening devices, including but not limited to a bolt (which may be coupled with a nut), a screw (which may be coupled with a nut), and a clamp. In addition, one or more hinges 116 are secured to one side of the enclosure cover 102 and a corresponding side of the enclosure body 124 so that, when all of the fastening devices 118 are removed, the enclosure cover 102 may swing outward (i.e., an open position) from the enclosure body 124 using the one or more hinges 116. In one or more exemplary embodiments, there are no hinges, and the enclosure cover 102 is separated from the enclosure body 124 when all of the fastening devices 118 are removed.

The enclosure cover 102 and the enclosure body 124 may be made of any suitable material, including metal (e.g., alloy, stainless steel), plastic, some other material, or any combination thereof. The enclosure cover 102 and the enclosure body 124 may be made of the same material or different materials.

In one or more embodiments, on the end of the enclosure body 124 opposite the enclosure cover 102, one or more mounting brackets 120 are affixed to the exterior of the enclosure body 124 to facilitate mounting the enclosure 100. Using the mounting brackets 120, the enclosure 100 may be mounted to one or more of a number of surfaces and/or elements, including but not limited to a wall, a control cabinet, a cement block, an I-beam, and a U-bracket.

The enclosure cover 102 may include one or more features that allow for user interaction while the enclosure 100 is sealed in the closed position. As shown in FIG. 1, one or more indicating lights (e.g., indicating light 1 106, indicting light 2 108) may be located on the enclosure cover 102. Each indicating light may be used to indicate a status of a feature or process associated with equipment inside the enclosure 100. For example, an indicating light may show a constant green light if a motor controlled by a VFD inside the enclosure 100 is operating. As another example, an indicating light may flash red when a motor controlled by a VFD inside the enclosure 100 has a problem (e.g., tripped circuit, VFD overheats, overcurrent situation). As another example, an indicating light may show a constant red light when an electromagnetic pulse caused by an explosion inside the enclosure 100 has resulted. An indicating light may be made of one or more materials (e.g., glass, plastic) using one or more different lighting sources (e.g., light-emitting diode (LED), incandescent bulb).

In one or more embodiments, the enclosure cover 102 may also include a switch handle 112 that allows a user to operate a switch (not shown) located inside the explosion-proof enclosure 100 while the explosion-proof enclosure 110 is closed. Those skilled in the art will appreciate that the switch handle 112 may be used for any type of switch. Each position (e.g., OFF, ON, HOLD, RESET) of the switch may be indicated by a switch position indicator 114 positioned adjacent to the switch handle 112 on the outer surface of the enclosure cover 102. A switch associated with the switch handle 112 and the switch position indicator 114 may be used to electrically and/or mechanically isolate, and/or change the mode of operation of, one or more components inside or associated with the explosion-proof enclosure 100. For example, the switch handle 112 may point to "OFF" on the switch position indicator 114 when a disconnect switch located inside the explosion-proof enclosure 100 is disengaged. In such a case, all equipment located inside the explosion-proof enclosure 100, as well as the equipment (e.g., a motor) controlled by the equipment located inside the explosion-proof enclosure 100, may be without power.

Referring now to FIG. 2, an example of an explosion-proof enclosure 100 in an open position in accordance with one or more embodiments is shown. The explosion-proof enclosure 100 is in the open position because the enclosure cover (not shown) is not secured to the enclosure body 124. The hinges 116 attached to the left side of the enclosure body 124 are also attached to the left side of the enclosure cover, which is swung outward from the enclosure body 124. Because the explosion-proof enclosure 100 is in the open position, the components of the explosion-proof enclosure 100 are visible to a user.

As described above with respect to FIG. 1, the enclosure body 124 includes two or more mounting brackets 120. In addition, in one or more embodiments, the enclosure body 124 includes an enclosure engagement surface 210, against which the enclosure cover meets when the explosion-proof enclosure 100 is in the closed position. A number of fastening device apertures 220 are shown around the enclosure engagement surface 210, where each of the fastening device apertures 220 are configured to receive a fastening device 118 that traverses through the enclosure cover 102, as described above with respect to FIG. 1. The number of fastening device apertures 220 may vary, depending on one or more of a number of factors, including but not limited to the size of the fastening device apertures 220, a standard that the explosion-proof enclosure 100 meets, and the type of fastening device 118 used. The number of fastening device apertures 220 may be zero.

In one or more embodiments, the explosion-proof enclosure 100 of FIG. 2 includes a mounting plate 202 that is affixed to the back of the inside of the explosion-proof enclosure 100. The mounting plate 202 may be configured to receive one or more components such that the one or more components are affixed to the mounting plate 202. The mounting plate 202 may include one or more apertures configured to receive securing devices that may be used to affix a component to the mounting plate 202. The mounting plate 202 may be made of any suitable material, including but not limited to the material of the enclosure body 124. In one or more exemplary embodiments, some or all of the one or more components may be mounted directly to an inside wall of the explosion-proof enclosure 100 rather than to the mounting plate 202.

In one or more embodiments, a VFD 206 is affixed to the mounting plate 202 inside the explosion-proof enclosure 100. The VFD 206 may include any components used to drive a motor and/or other device using variable control signals for controlled starts, stops, and/or operations of the motor and/or other devices. Examples of components of a VFD include, but are not limited to, discrete relays, a programmable logic controller (PLC), a programmable logic relay (PLR), an uninterruptible power supply (UPS), and a distributed control system (DSC). In one or more exemplary embodiments, one or more components of the VFD may replace the VFD. For example, the VFD may be substituted by one or more PLCs, one or more PLRs, one or more UPSs, one or more DCSs, and/or other heat-generating components.

In one or more embodiments, a switch 208 is affixed to the mounting plate 202 inside the explosion-proof enclosure 100. The switch 208 may be configured to electrically and/or mechanically isolate, and/or change the mode of operation of, one or more components located inside the explosion-proof enclosure 100 and/or one or more components located outside the explosion-proof enclosure 100. The switch 208 may be any type of switch, including but not limited to a disconnect switch, a test switch, a reset switch, an indicator switch, and a relay switch. For example, the switch 208 may be a disconnect switch that is used to cut off power to all components in the explosion-proof enclosure 100 and all devices located outside the explosion-proof enclosure 100 that are controlled by the components inside the explosion-proof enclosure 100. As another example, the switch 208 may be a bypass switch that is used to deactivate a protection scheme (e.g., a relay) or some other particular component or group of components located inside the explosion-proof enclosure 100.

The switch 208 may further be configured to receive, through mechanical and/or electrical means, a directive to change states (e.g., open, closed, hold) from a component located on the enclosure cover. For example, if the enclosure cover includes a switch handle (as described above with respect to FIG. 1), then a switch handle shaft 232 may extend from the switch handle through the enclosure cover to a switch coupling 230 of the switch 208. When the explosion-proof enclosure 100 is in the closed position, the switch handle shaft 232 couples with the switch coupling 230, and switch 208 may be operated by operating the switch handle located outside the explosion-proof enclosure, as described above with respect to FIG. 1.

In one or more embodiments, one or more relays (e.g., relay 212) are affixed to the mounting plate 202 inside the explosion-proof enclosure 100. A relay 212 may be configured to control one or more operations of one or more components located in, or associated with, the explosion-proof enclosure 100. Specifically, a relay 212 may, through one or more relay contacts, allow electrical current to flow and/or stop electrical current from flowing to one or more components in the enclosure 100 based on whether a coil of the relay 212 is energized or not. For example, if the coil of the relay 212 is energized, then a contact on the relay may be closed to allow current to flow to energize a motor. The relay 212 may be activated based on a timer, a current, a voltage, some other suitable activation method, or any combination thereof. The relay 212 may also be configured to emit a signal when a condition has occurred. For example, the relay 212 may flash a red light to indicate that the VFD 206 is in an alarm state.

In one or more embodiments, wiring terminals 214 are affixed to the mounting plate 202 inside the explosion-proof enclosure 100. Wiring terminals 214 are a series of terminals where one terminal is electrically connected to at least one other terminal in the series of terminals while remaining electrically isolated from the remaining terminals in the series of terminals. In other words, two or more terminals among the series of terminals act as a junction point where multiple wires may be electrically connected through the joined terminals.

In one or more embodiments, one or more entry holes 216 may extend through one or more sides (e.g., bottom) of the enclosure body 124. Each entry hole 216 may be configured to allow cables and/or wiring for power, control, and/or communications to pass through from outside the explosion-proof enclosure 100 to one or more components inside the explosion-proof enclosure 100. An entry hole 216 may be joined with a conduit and coupling from outside the explosion-proof enclosure 100 to protect the cables and/or wiring received by the entry hold 216 and to help maintain the integrity of the explosion-proof enclosure 100 through the entry hole 216.

Figure 3A:
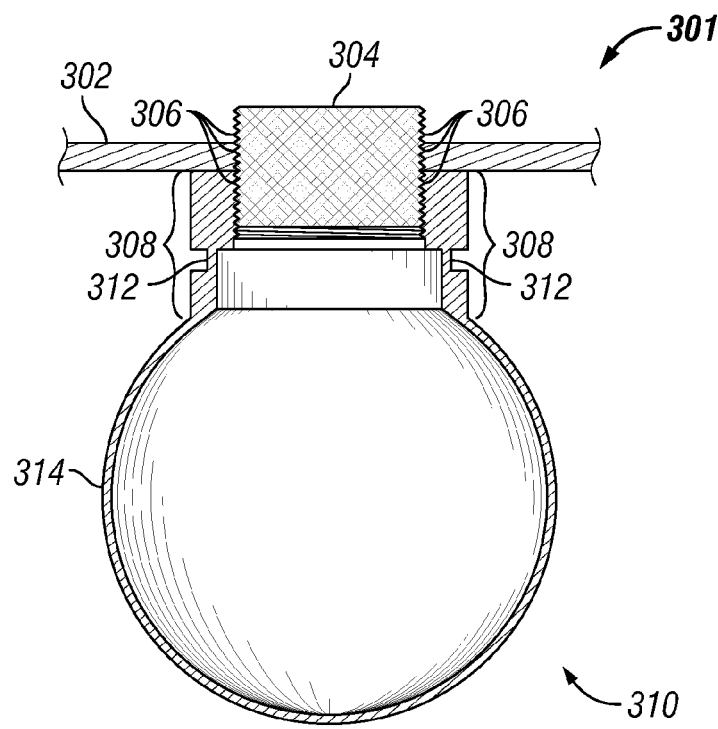
FIGS. 3A through 3F show various examples of portions of a pre-filter assembly in accordance with one or more exemplary embodiments of pre-filtration for explosion-proof enclosures.
Figure 3B:
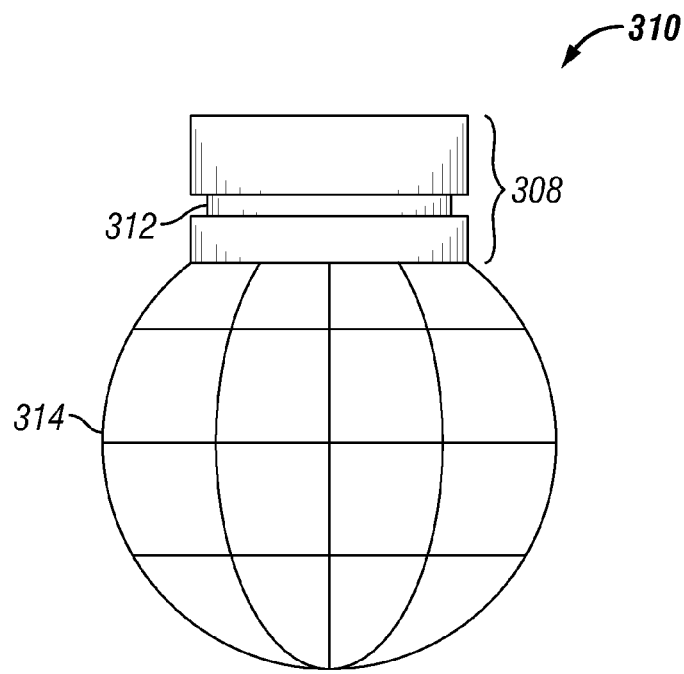
Figure 3C:
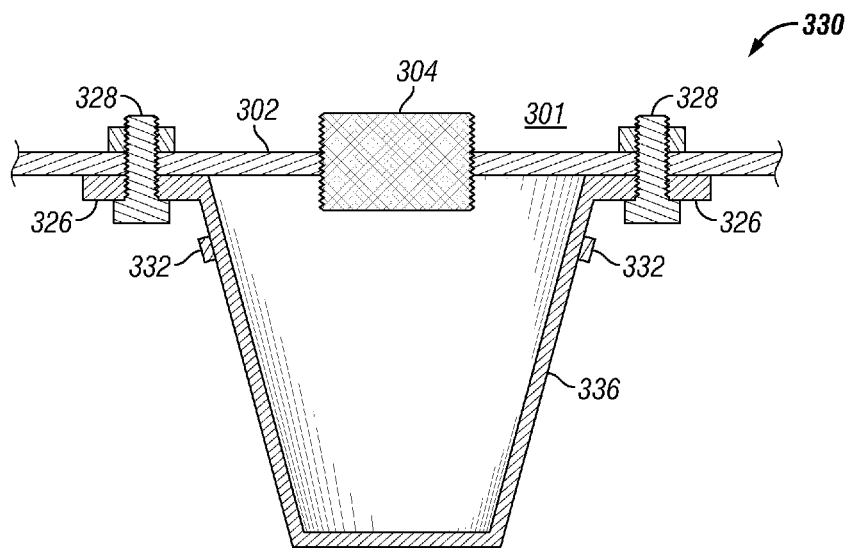
Figure 3D:
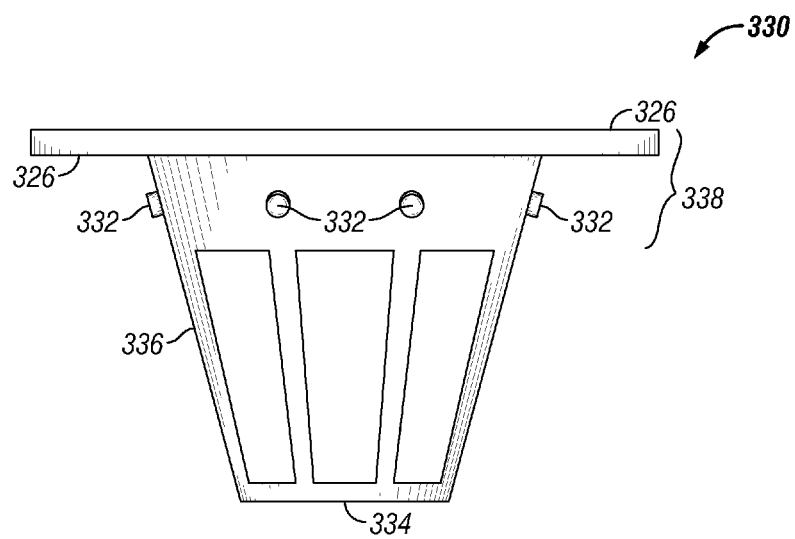
Figure 3E:
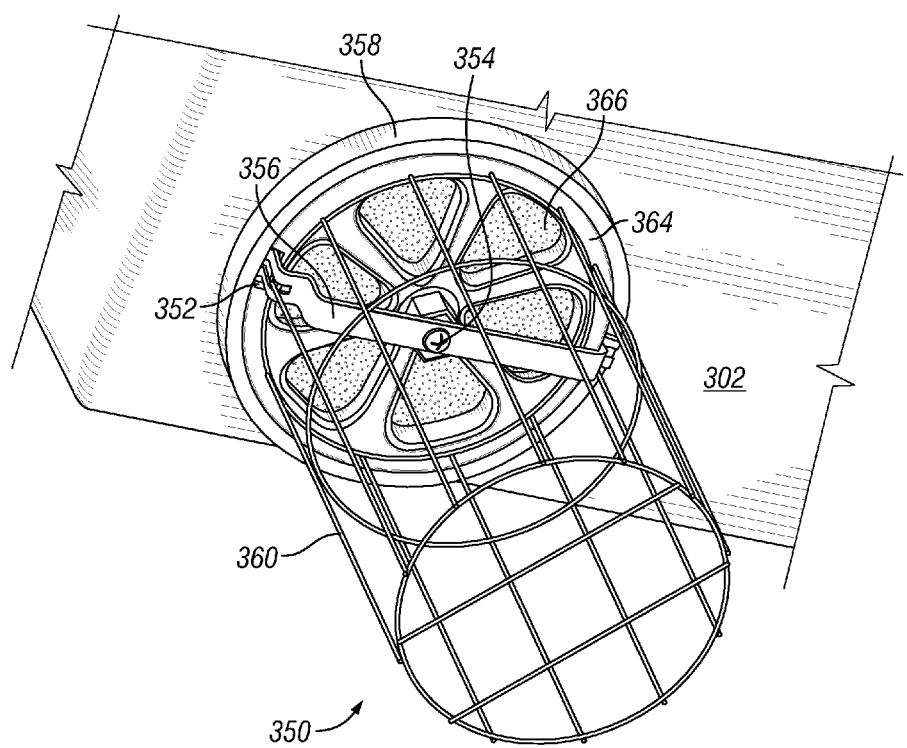
Figure 3F:
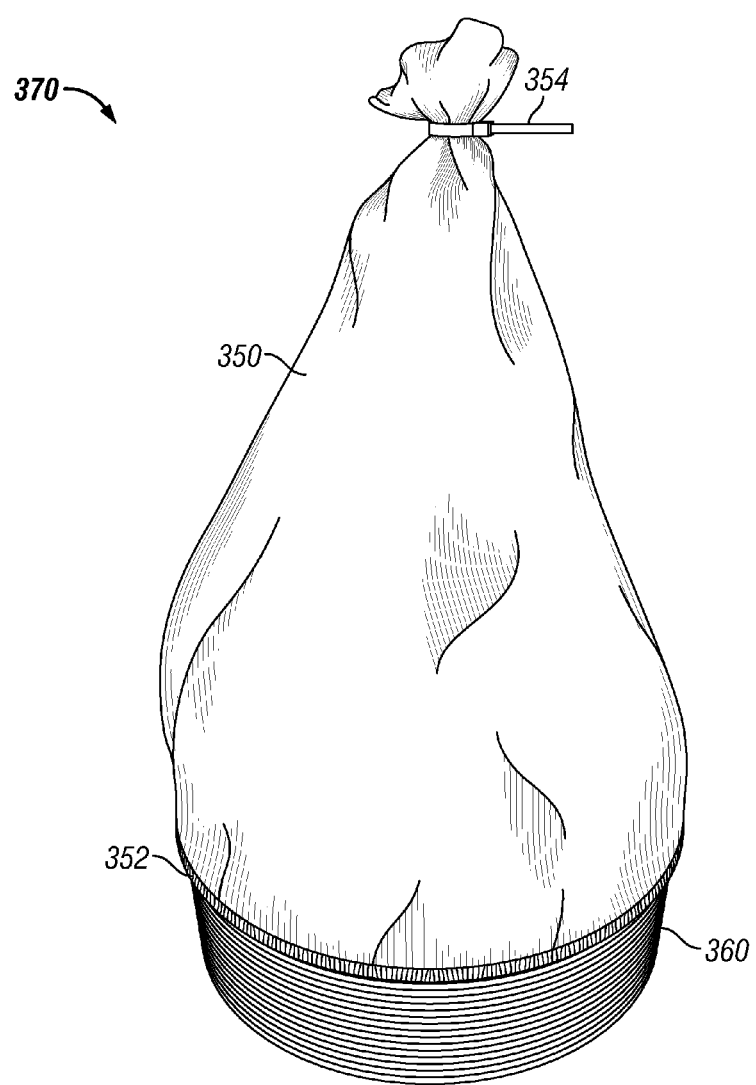

FIGS. 3A through 3F show various examples of portions of a pre-filter assembly in accordance with one or more exemplary embodiments. Specifically, FIGS. 3A and 3C each show a cross-sectional side view of a portion of the pre-filter assembly; FIGS. 3B and 3D each show a side view of a pre-filter frame of a pre-filter assembly; FIG. 3 shows a perspective view of a portion of a pre-filter assembly; and FIG. 3F shows a side view of a pre-filter material. Each of these views of the pre-filter assembly is described below. Embodiments of pre-filtration for explosion-proof enclosures are not limited to the configurations shown in FIGS. 3A through 3F and discussed herein.

In FIG. 3A, the cross-sectional side view of pre-filter assembly 1 310 shows that the base 308 of pre-filter assembly 1 310 is coupled to a filter assembly 304 in accordance with one or more exemplary embodiments. Specifically, in this example, the base 308 of pre-filter assembly 1 310 is coupled to the filter assembly 304 using mating threads 306 on both the outer wall of the filter assembly 304 and the inner wall of the base 308 of pre-filter assembly 1 310. A pre-filter assembly (e.g., pre-filter assembly 1 310) may be coupled to a filter assembly (e.g., filter assembly 304) using one or more other coupling techniques, including but not limited to an adjustable clamp, a plastic cable tie, string, rope, an elastic band, a rubber band, bolting, welding, using epoxy, brazing, press fitting, mechanically connecting, using a flat joint, and using a serrated joint.

While the filter assembly (e.g., filter assembly 304) may comply with one or more standards for an explosion-proof enclosure, the pre-filter assembly (e.g., pre-filter assembly 1 310) may not comply with such standards. The pre-filter assembly (e.g., pre-filter assembly 1 310), including the base (e.g., base 308) and reinforcement structure (e.g., reinforcement structure 1 314), may be made of one or more different materials, including but not limited to plastic, metal, wood, rubber, a composite material, and fiberglass.

Pre-filter assembly 1 310 shown in FIG. 3A also includes a channel 312 that wraps around a portion of the base 308 of pre-filter assembly 1 310 and is used to receive a locking band (not shown) of some type, where the locking band secures the pre-filter material to pre-filter assembly 1 310 while air is flowing (either toward or away from the explosion-proof enclosure 301) through pre-filter assembly 1 310. In other words, the locking band is positioned over pre-filter material before being secured in the channel 312.

The locking band may also be configured to minimize air leakage so that, as air flows through the pre-filter material, substantially no air flows where the pre-filter material is secured to the base of the pre-filter assembly. The locking band may be any type of band capable of maintaining an amount of tension while positioned within the channel 312. Examples of a locking band include, but are not limited to, an adjustable clamp, a plastic cable tie, string, rope, an elastic band, and a rubber band.

In one or more exemplary embodiments, a pre-filter assembly (e.g., pre-filter assembly 1 310) is configured to control the air that passes through the pre-filter assembly. Specifically, the pre-filter assembly may be configured to contain a fire, suppress a fire, remove dust and other particles from the air, remove moisture from the air, and/or cool the air that enters a filter assembly (e.g., filter assembly 304). Further, the pre-filter material may have a density sufficient to allow a minimal amount of air to pass through the pre-filter assembly 310. The pre-filter material may also be able to withstand high temperatures and occasional situations where a fire exists in an area proximate to the pre-filter material.

Continuing with FIG. 3A, the filter assembly 304 is also coupled to the explosion-proof enclosure wall 302. In one or more exemplary embodiments, the filter assembly 304 includes a housing with a threaded outer wall (e.g., mating threads 306) and a cavity within the inner walls of the housing. Further, a filter made of a material (e.g., sintered material) may be positioned within the cavity and coupled to the housing. The filter may be coupled to the housing in one or more of a number of ways, including but not limited to mating threads, welding, using epoxy, brazing, press fitting, mechanically connecting, using a flat joint, and using a serrated joint.

In one or more exemplary embodiments, the filter assembly 304 is coupled to the explosion-proof enclosure wall 302. The filter assembly 304 may be coupled to the explosion-proof enclosure wall 302 using one or more of a number of coupling techniques, including but not limited to mating threads, bolting, welding, using epoxy, brazing, press fitting, mechanically connecting, using a flat joint, and using a serrated joint. The configuration shown in FIG. 3A represents a portion of the explosion-proof enclosure 301 where inlet air is taken into the explosion-proof enclosure 301 after passing through the pre-filter assembly 310 and the filter assembly 304.

In one or more exemplary embodiments, the filter assembly 304 is configured to allow air to pass from outside the explosion-proof enclosure 301 to inside the explosion-proof enclosure 301. When ambient air passes from outside the explosion-proof enclosure 301 to inside the explosion-proof enclosure 301, the filter assembly 304 may be called an intake air filter assembly.

In one or more exemplary embodiments, the filter assembly 304 is further configured to control the air that passes through the filter assembly 304. Specifically, the filter assembly 304 may further be configured to contain a fire, suppress a fire, remove dust and other particles from the air, remove moisture from the air, and/or cool the air that enters the explosion-proof enclosure 301. In one or more exemplary embodiments, the filter of the filter assembly 304 is shaped in a manner to fit snugly inside the cavity (not shown) of the housing of the filter assembly 304 without significant gaps between the filter and the housing. The filter of the filter assembly 304 may be made of one or more materials, including but not limited to sintered material, paper, ceramic, rubber, steel, aluminum, plastic, an alloy metal, some other suitable material, or any combination thereof.

The filter of the filter assembly 304 may have a density sufficient to allow a minimal amount of air to pass through the filter assembly 300. For example, the filter of the filter assembly 304 may have a density sufficient to allow at least 0.01 cubic feet per minute of the air to pass through the filter assembly 304. Further, the filter of the filter assembly 304 may be able to withstand high temperatures and occasional situations where a fire exists in an area proximate to the filter of the filter assembly 304.

FIG. 3B shows a side view of pre-filter assembly 1 310 in accordance with one or more exemplary embodiments. This side view of pre-filter assembly 1 310 shows the channel 312 extending across the entire width of a portion of the base 308 of pre-filter assembly 1 310. Further, reinforcement structure 1 314 is coupled to the base 308 of pre-filter assembly 1 310. The reinforcement structure (e.g., reinforcement structure 1 314) may be configured to ensure that the pre-filter material does not collapse and reduce the flow of intake air drawn into the explosion-proof enclosure. The reinforcement structure (e.g., reinforcement structure 1 314) may be positioned between the pre-filter material and the filter assembly (e.g., filter assembly 304). Reinforcement structure 1 314 in this example has a spherical shape with intersecting vertical and horizontal components. Reinforcement structure 1 314 may have one of a number of other shapes, including but not limited to a rectangle, a cone, a cylinder, and a triangle.

In one or more exemplary embodiments, the vertical and/or horizontal components of reinforcement structure 1 314 may have any thickness suitable to support the pre-filter material as intake air is drawn into the explosion-proof enclosure. Further, the spacing between the vertical and/or horizontal components of reinforcement structure 1 314 may vary. The thickness and/or spacing of the components of reinforcement structure 1 314 may depend on one or more of a number of factors, including but not limited to rate of air flow, temperature, and pressure differential. The vertical and/or horizontal components of reinforcement structure 1 314 may be fixedly attached (e.g., welded, tied) to each other as such components intersect. Alternatively, the vertical and/or horizontal components of reinforcement structure 1 314 may not be directly coupled to each other, allowing for a less rigid structure supporting the pre-filter material.

FIG. 3C shows a cross-sectional side view of pre-filter assembly 2 330 in accordance with one or more exemplary embodiments. Specifically, FIG. 3C shows that the flange 326 of pre-filter assembly 2 330 is coupled to an exterior side of the explosion-proof enclosure wall 302. In other words, pre-filter assembly 2 330 is not coupled to the filter assembly 304. In this example, the flange 326 of pre-filter assembly 2 330 is coupled to the explosion-proof enclosure 302 using one or more of a number of fastening devices 328 (e.g., bolts, nuts) that extend through apertures in the flange 326 of pre-filter assembly 2 330 and the explosion-proof enclosure wall 302. The flange (e.g., flange 326) of the pre-filter assembly (e.g., pre-filter assembly 2 330) may be coupled to an explosion-proof enclosure (e.g., explosion-proof enclosure 302) using one or more other coupling techniques, including but not limited to mating threads, welding, using epoxy, brazing, press fitting, mechanically connecting, using a flat joint, and using a serrated joint. In one or more exemplary embodiments, the coupling technique used to couple the flange 326 of pre-filter assembly 2 330 to the explosion-proof enclosure wall 302 maintains the explosion-proof integrity of the explosion-proof enclosure 301.

Pre-filter assembly 2 330 also includes a number of snap receivers 332 that are affixed to, and positioned somewhat equidistantly around, a portion of the base of pre-filter assembly 2 330 located a short distance from the flange 326. Each of the snap receivers 332 is configured to receive a snap (not shown) affixed to the pre-filter material, where the snaps snap onto the snap receivers 332 to secure the pre-filter material to pre-filter assembly 2 330. Those skilled in the art will appreciate that other mechanisms (e.g., Velcro, latches, locks, bolts, welding, mating threads, epoxy, zipper, sewing thread) may be used to couple the pre-filter material to the pre-filter frame of the pre-filter assembly, either on a temporary or permanent basis. In one or more exemplary embodiments, the pre-filter material may similarly be coupled to the explosion-proof enclosure and/or the filter assembly, either in addition to or instead of being coupled to the pre-filter assembly.

As described above with respect to FIG. 3A, the filter assembly 304 in FIG. 3C may also be similarly coupled to the explosion-proof enclosure wall 302. The configuration shown in FIG. 3C represents a portion of the explosion-proof enclosure 301 where inlet air passes through the filter assembly 304 into the explosion-proof enclosure 301.

FIG. 3D shows a side view of pre-filter assembly 2 330. This side view of pre-filter assembly 2 330 shows four snap receivers 332 affixed to, and spaced equidistantly upon, a portion of the base of pre-filter assembly 2 330. Specifically, the four snap receivers 332 are located between the flange 326 and reinforcement structure 2 336. Reinforcement structure 2 336 is located above the flange 326 and snap receivers 332 on pre-filter assembly 2 330. Reinforcement structure 2 336 in this example has a conical shape with spaced vertical components that traverse from the base to a flattened top 334 of pre-filter assembly 2 330.

FIG. 3E shows a portion of pre-filter assembly 3 350 in accordance with one or more exemplary embodiments. Specifically, FIG. 3E shows that reinforcement structure 3 360 is formed as a type of cylindrical mesh cage. Further, reinforcement structure 3 360 includes a base 358 that fits outside an outer perimeter of a filter structure 364 that protrudes through the explosion-proof enclosure wall 302. Alternatively, reinforcement structure 3 360 may have no base 358. The filter structure 364 encases a filter 366.

Reinforcement structure 3 360 may be coupled to the filter structure 364 using a clamp 356. The clamp 356 may have a length greater than the diameter of reinforcement structure 3 360 where reinforcement structure 3 360 meets the top of the filter structure 364. Each end of the clamp 356 may include a clip that fits over a portion of reinforcement structure 3 360 and secures into a notch 352. The notch 352 may be located in the filter structure 364 and/or the base 358 of reinforcement structure 3 360. The clamp 356 may also be coupled to the filter structure 364 in a different location, independent of reinforcement structure 3 360. In this example, the clamp 356 is coupled to the filter structure 364 with a fastening device 354 that traverses an aperture approximately in the center of the clamp 356 as well as an aperture in the approximate center of the filter assembly 364. FIG. 3E shows that a hexagonal boss is located at the approximate center of the filter assembly 364 and receives the fastening device 354.

FIG. 3F shows an example of pre-filter assembly 4 370 having pre-filter material 376 that is positioned over a pre-filter frame (not shown) and coupled to a filter assembly 380 in accordance with one or more exemplary embodiments. In this example, the pre-filter material 376 is coupled to filter assembly 380 using an elastic band 372 integrated with a bottom portion of the pre-filter material 376. Specifically, the perimeter of the elastic band 372 in an unstretched state is less than the perimeter of the outer surface of the filter assembly 380. As the elastic band 372 is stretched to fit over the outer surface of the filter assembly 380, the elastic band 372 couples the pre-filter material 376 to the outer surface of the filter assembly 380 while the elastic band 372 is under tension. At the top end of the pre-filter assembly, the pre-filter material 376 is gathered by a binding device 374 (e.g., a string, a cable tie) to provide more control of the air passing through the pre-filter assembly.

In one or more exemplary embodiments, the surface area of the pre-filter material 376 is greater than the surface area of a filter of the filter assembly 380, where the filter of the filter assembly 380 receives the air passing through pre-filter assembly 4 370. The pre-filter material 376 may consist of one or more materials, including but not limited to polyester, a stainless steel, paper, aluminum, and an alloy. The pre-filter material 376 may be made of the same material as, or different material than, the filter of the filter assembly.

In one or more embodiments, a filter system (e.g., filter assembly, pre-filter assembly), such as the filter systems described above with respect to FIGS. 3A through 3F, may be combined with a maintenance sensing system, such as the maintenance sensing system described below with respect to FIG. 4. Specifically, maintenance sensing and maintenance operations, as described below, may be incorporated into a filter system.

Figure 4:
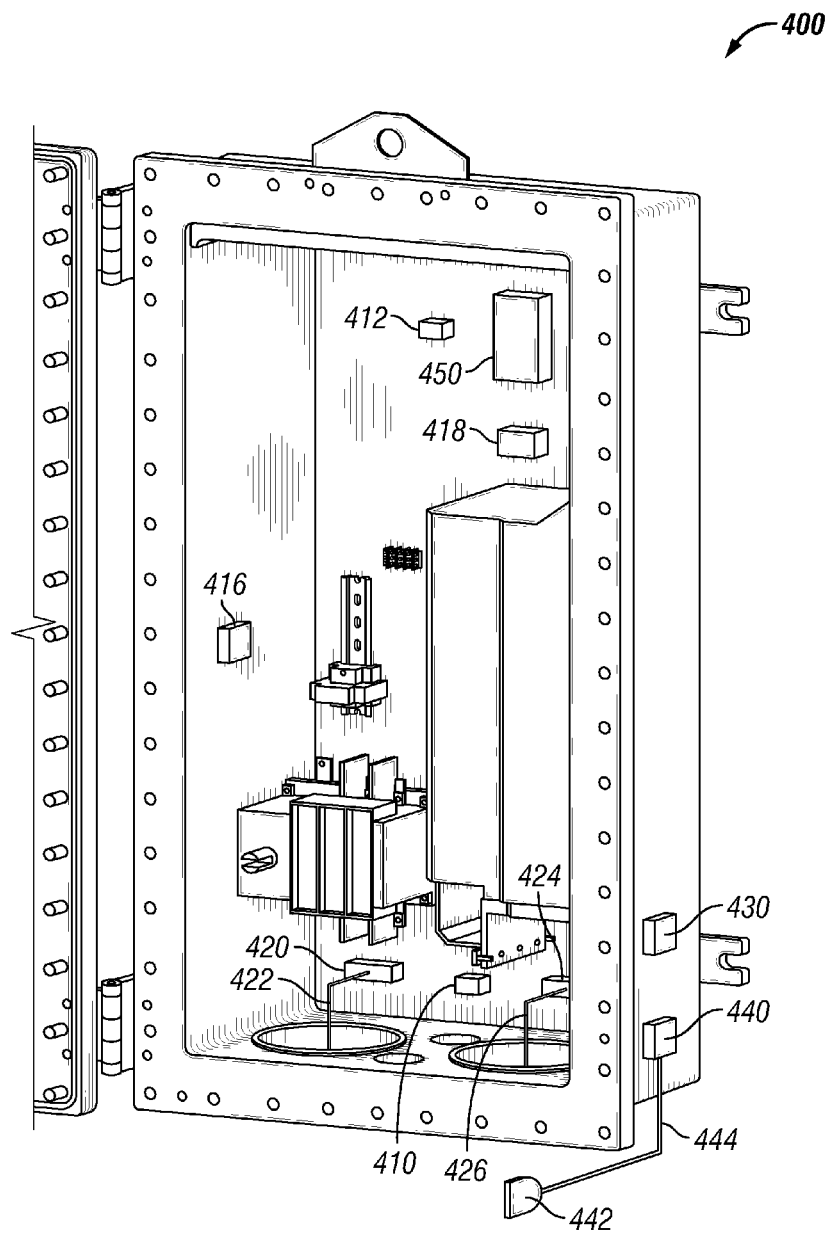
FIG. 4 shows an explosion-proof enclosure with maintenance sensing in accordance with one or more exemplary embodiments.

FIG. 4 shows an explosion-proof enclosure 400 with maintenance sensing in accordance with one or more exemplary embodiments. Specifically, FIG. 4 shows the interior of an explosion-proof enclosure 400 that includes two pressure sensors (pressure sensor 1 410, pressure sensor 2 412), a temperature sensor 416, and an air flow sensor 418. In addition, the explosion-proof enclosure 400 of FIG. 4 includes two air puffers (air puffer device 1 420, air puffer device 2 424), a vibration device 430, and a mechanical cleaning device 440. Other features shown but not described and/or labeled in the explosion-proof enclosure 400 of FIG. 4 are described and/or labeled above with respect to FIGS. 2 and 3, including a filter system (e.g., filter assembly, pre-filter assembly). Each of these elements of the explosion-proof enclosure 400 is described below. Embodiments of maintenance sensing for explosion-proof enclosures are not limited to the configurations shown in FIG. 4 and discussed herein. For example, the location of certain devices and/or sensors may vary in embodiments of the invention.

As shown in FIG. 4, maintenance sensing for explosion-proof enclosures may use one or more devices (e.g., sensors) to measure one or more operating parameters (also called an operating value or a measured value) within or adjacent to the explosion-proof enclosure 400. In one or more embodiments, an operating parameter is a measurable aspect associated with the explosion-proof enclosure 400. Examples of an operating parameter include, but are not limited to, temperature, air flow, pressure, current, voltage, and impedance. An operating parameter may be measured at any time, including when equipment within the explosion-proof enclosure 400 is not operating.

In one or more embodiments, a value of an operating parameter is measured by a sensor. A sensor may be any device that is configured to measure one or more operating parameters. A sensor may measure an operating parameter continually, at certain time intervals, and/or upon the occurrence of an event (e.g., start of a piece of equipment associated with the explosion-proof enclosure 400). A sensor may be located at any location (e.g., inside, adjacent to) relative to the explosion-proof enclosure 400 to accurately measure an operating parameter.

In one or more embodiments, a sensor may be configured with a storage repository (i.e., memory). Further, a sensor may be configured to communicate (using physical wires and/or wireless technology) with one or more other sensors and/or a control device 450. A sensor may communicate (e.g., send signals, receive signals) on a real-time basis, at regular time intervals, at the occurrence of certain events (e.g., a minimal change in the measured value of an operating parameter), and/or based on some other factor. Further, a sensor may be configured to withstand the environmental conditions (e.g., heat, humidity, pressure, air flow) that may exist at the location where the sensor is placed.

In one or more embodiments, one or more pressure sensors (e.g., pressure sensor 1 410, pressure sensor 2 412) are used to measure air pressure at a particular location. As shown in FIG. 4, pressure sensor 1 410 is located on the mounting plate inside the explosion-proof enclosure 400 proximate to the entry holes and filter apertures on the lower end of the explosion-proof enclosure 400. In addition, pressure sensor 2 412 is located on the mounting plate inside the explosion-proof enclosure 400 toward the top end of the explosion-proof enclosure 400. In such a case, pressure sensor 1 410 may be used to monitor an inlet pressure of the explosion-proof enclosure 400, and pressure sensor 2 412 may be used to monitor an outlet pressure of the explosion-proof enclosure 400.

In one or more embodiments, multiple pressure sensors may be used to determine a pressure differential between the pressure sensors. A pressure sensor may be a type of transducer or any other type of measuring device capable of accurately measuring pressure. A pressure sensor may also be located outside the explosion-proof enclosure 400, such as between the pre-filter assembly and the filter assembly (as described above with respect to FIGS. 3A through 3F).

In one or more embodiments, one or more temperature sensors (e.g., temperature sensor 416) are used to measure temperature at a particular location. As shown in FIG. 4, temperature sensor 416 is located on an inner side of the explosion-proof enclosure 400. In such a case, temperature sensor 416 may be configured to measure the temperature inside the explosion-proof enclosure 400.

In one or more embodiments, one or more air flow sensors (e.g., air flow sensor 418) are used to measure air flow at a particular location. As shown in FIG. 4, air flow sensor 418 is located on the mounting plate inside the explosion-proof enclosure 400 slightly below pressure sensor 2 412 and the control device 450. In such a case, air flow sensor 418 may be used to monitor a rate of air flow from the bottom (e.g., inlet) of the explosion-proof enclosure 400 to the top (e.g., outlet) of the explosion-proof enclosure 400.

In one or more embodiments, the control device 450 is configured to communicate with each of the sensors (e.g., pressure sensor 2 412, air flow sensor 418) used to measure one or more operating parameters associated with the explosion-proof enclosure 400. Specifically, the control device 450 may be configured to receive signals (e.g., measurements) from one or more sensors that measure operating parameters associated with the explosion-proof enclosure 400. Further, the control device 450 may be configured to send signals (e.g., requests for a measurement) to one or more sensors.

In one or more embodiments, the control device 450 is further configured to store one or more threshold values for one or more operating parameters. A threshold value is a value for an operating parameter that triggers a maintenance operation (defined below). The threshold value may be in the same units of measure as the measured value (i.e., operating value), measured by a sensor, for an operating parameter. The control device 450 may further be configured to convert the threshold value and/or operating value for an operating parameter so that the threshold value and the operating value are in the same units of measure. The threshold values stored by the control device 450 may be default values, values determined by a user, calculated values, values determined in some other suitable manner, or any combination thereof.

In one or more embodiments, the control device 450 is further configured to determine, based on the measurements received from the one or more sensors, whether maintenance on one or more elements (e.g., pre-filter assembly, filter assembly) associated with, and/or located within, the explosion-proof enclosure 400 require maintenance. The control device 450 may also be configured to determine the urgency of maintenance that may be required for one or more elements associated with, and/or located within, the explosion-proof enclosure 400. In one or more embodiments, the measurements from each sensor are associated with one or more threshold values, above (or in some cases, below) which triggers a maintenance operation (and in some cases a recommended time for action) by the control device 450.

For example, based on pressure measurements taken by and received from pressure sensor 1 410 and pressure sensor 2 412, the control device 450 may determine that the pressure differential is slightly less than 1 pound per square inch (psi). As a result, the control device 450 may determine that the pre-filter assembly should be cleaned within the next 30 days and subsequently sends a notification to a user.

As another example, based on an initial temperature taken by and received from the temperature sensor 416, the control device 450 determines that the initial temperature exceeds a threshold amount. Consequently, the control device 450 determines that maintenance should be performed on the filter assembly within the next thirty days and sends a notification to a user to that affect. A few hours later, based on a subsequent temperature taken by and received from the temperature sensor 416, the control device 450 determines that the subsequent temperature exceeds a higher threshold amount. Consequently, the control device 450 determines that maintenance should be performed on the filter assembly within the next hour and sends a notification to a user to that affect.

Excessive temperatures measured by the temperature sensor 416 may also, or alternatively, be attributable to one or more other devices (e.g., blower, VFD) within the explosion-proof enclosure 400. In one or more exemplary embodiments, the control device 450 may be configured to determine, based on input received from one or more other sensing devices (e.g., a pressure sensor, an air flow sensor) and/or other operational inputs (e.g., loss of power, overcurrent to the VFD), whether a temperature exceeding a threshold amount is caused by the filter assembly or by some other device inside the explosion-proof enclosure 400. Similarly, the control device 450 may be configured to determine whether one or more other operating parameters (e.g., a pressure reading, a pressure differential, an air flow reading) is caused by the filter assembly or by some other device inside the explosion-proof enclosure 400.

In one or more embodiments, the control device 450 may further be configured to send a notification to a user. The notification may inform one or more users of a maintenance issue that has arisen with respect to one or more elements associated with, and/or located within, the explosion-proof enclosure 400. For example, the notification may notify a user that the pre-filter assembly should be cleaned within the next 30 days. The notification may be communicated in one or more ways, including but not limited to an email, a text message (e.g., short message service), an alert on a control panel, a siren, and a flashing light located proximate to the explosion-proof enclosure 400.

In one or more embodiments, the control device 450 is further configured to cut off power to one or more elements associated with, and/or located within, the explosion-proof enclosure 400. The control device 450 may cut off power to one or more elements based on a severe maintenance issue that the control device 450 has determined using one or more measurements of operating parameters received from one or more sensors. For example, the control device 450 may cut off power to all equipment, except for a vent fan, located within the explosion-proof enclosure 400 when the control device 450 receives a signal from the temperature sensor 416 that measures the temperature inside the explosion-proof enclosure 400 at 60° C.

In one or more embodiments, the control device 450 may further be configured to communicate with one or more maintenance devices (described below) used to perform maintenance operations on one or more elements associated with, or located inside of, the explosion-proof enclosure 400. Specifically, the control device 450 may be configured to receive signals (e.g., confirming performance of a maintenance operation) from one or more maintenance devices that perform a maintenance function on one or more elements associated with, or located inside, the explosion-proof enclosure 400. Further, the control device 450 may be configured to send signals (e.g., command to perform a maintenance operate, command to cease performance of a maintenance operation) to one or more maintenance devices.

In one or more embodiments, a maintenance operation is a function performed by one or more of the maintenance devices and/or the control device 450. Specifically, the maintenance operation performed by the one or more maintenance devices and/or the control device 450 is designed to resolve a risk or reduce a risk that affects one or more elements associated with, or located inside, the explosion-proof enclosure 400. Examples of a maintenance operation may include, but are not limited to, cutting off power to one or more elements, cleaning a pre-filter assembly, cleaning a filter assembly, and sending a notification to a user.

In one or more embodiments, a maintenance device includes one or more air puffer devices (e.g., air puffer device 1 420, air puffer device 2 424), one or more vibration devices (e.g., vibration device 430), and/or one or more mechanical cleaning devices (e.g., mechanical cleaning device 440). Those skilled in the art will appreciate that other maintenance devices (e.g., a fan) may be used in one or more embodiments of maintenance sensing for explosion-proof enclosures.

In one or more embodiments, each air puffer device (e.g., air puffer device 1 420, air puffer device 2 424) is configured to perform a maintenance operation. Specifically, each puffer device is configured to direct bursts of air at a specific location. Each air puffer device may include an air puffer line (e.g., air puffer line 1 422, air puffer line 2 426) that directs the burst of air to the location. Specifically, with regard to the example shown in FIG. 4, each air puffer line (e.g., air puffer line 1 422, air puffer line 2 426) has a first end that receives a burst of air generated by the air puffer device and a second end that sends the burst of air to the specific location.

In one or more embodiments, each air puffer device is configured to generate bursts of air and/or stop generating bursts of air based on a signal received from the control device 450. Further, an air puffer device may be configured to send a signal to the control device 450 to notify the control device 450 that the air puffer device has generated bursts of air and/or stopped generating bursts of air.

In this example shown in FIG. 4, the air puffer devices (i.e., air puffer device 1 420, air puffer device 2 424) are located on the mounting plate inside the explosion-proof enclosure 400 proximate to the filter apertures on the lower end of the explosion-proof enclosure 400. In addition, the air puffer lines (i.e., air puffer line 1 422, air puffer line 2 426) are directed toward the filter apertures at the bottom of the interior of the explosion-proof enclosure 400. The bursts of air generated by the air puffer devices (i.e., air puffer device 1 420, air puffer device 2 424) may be used to remove dirt, dust, and other materials that have accumulated on a filter of a filter assembly and/or a pre-filter material of a pre-filter assembly.

Alternatively, or in addition, an air moving device (not shown) may be located inside the explosion-proof enclosure 400. The air moving device (e.g., a fan, a blower) may be configured to induce ambient air to flow through an air intake filter assembly, inside the explosion-proof enclosure, and through an exhaust air filter assembly. In such a case, the air moving device may further be configured to cause air to flow in the reverse direction. For example, the control device 450 may be configured to change the operational characteristics (e.g., reverse a blower motor) of the air moving device and/or operate one or more valves of an air duct system (not shown) located inside the explosion-proof enclosure so that at least some air flows from inside the explosion-proof enclosure 400 through the air intake filter assembly to outside the explosion-proof enclosure 400.

In one or more embodiments, the vibration device 430 is configured to perform a maintenance operation. Specifically, the vibration device 430 is configured to generate vibrations. The vibration device 430 may be considered a vibration mechanism. The rate and strength of vibration generated by the vibration device 430 may vary. For example, the vibration device 430 may be configured to vibrate at a rate and/or strength sufficient to cause dirt, dust, and other materials that have accumulated on a filter system (e.g., a filter of a filter assembly and/or a pre-filter material of a pre-filter assembly), coupled to an outer wall on the bottom of the explosion-proof enclosure, to shake loose. As shown in FIG. 4, the vibration device 430 is located on an outer side of the explosion-proof enclosure. In one or more embodiments, the vibration device 430 is coupled directly to the element(s) that require a maintenance operation performed by the vibration device 430.

In one or more embodiments, the vibration device 430 is configured to generate vibrations and/or stop generating vibrations based on a signal received from the control device 450. Further, the vibration device 430 may be configured to send a signal to the control device 450 to notify the control device 450 that the vibration device 430 has generated vibrations and/or stopped generating vibrations.

In one or more embodiments, the mechanical cleaning device 440 is configured to perform a maintenance operation. Specifically, the mechanical cleaning device 440 is configured to operate a paddle 442. The paddle 442 is coupled to the mechanical cleaning device 440 by an arm 444. The arm 444 may have one or more hinges to allow for better control of the paddle 442 by the mechanical cleaning device 440.

The paddle 442 may be of any shape, size, and texture (e.g., solid, mesh, sawtooth) suitable for performing a maintenance function. Specifically, the paddle may be configured to strike one or more elements. For example, the mechanical cleaning device 440 may operate the paddle 442 so that the paddle strikes a portion of a filter system (e.g., a portion of a filter assembly and/or a portion of a pre-filter assembly), coupled to an outer wall on the bottom of the explosion-proof enclosure 400, to shake loose dirt, dust, and other materials that have accumulated on a filter of the filter assembly and/or a pre-filter material of the pre-filter assembly.

In one or more embodiments, the mechanical cleaning device 440 is configured to operate the paddle 442 and/or stop operating the paddle 442 based on a signal received from the control device 450. Further, the mechanical cleaning device 440 may be configured to send a signal to the control device 450 to notify the control device 450 that the vibration device 430 has operated the paddle 442 and/or stopped operating the paddle 442.

Figure 5A:
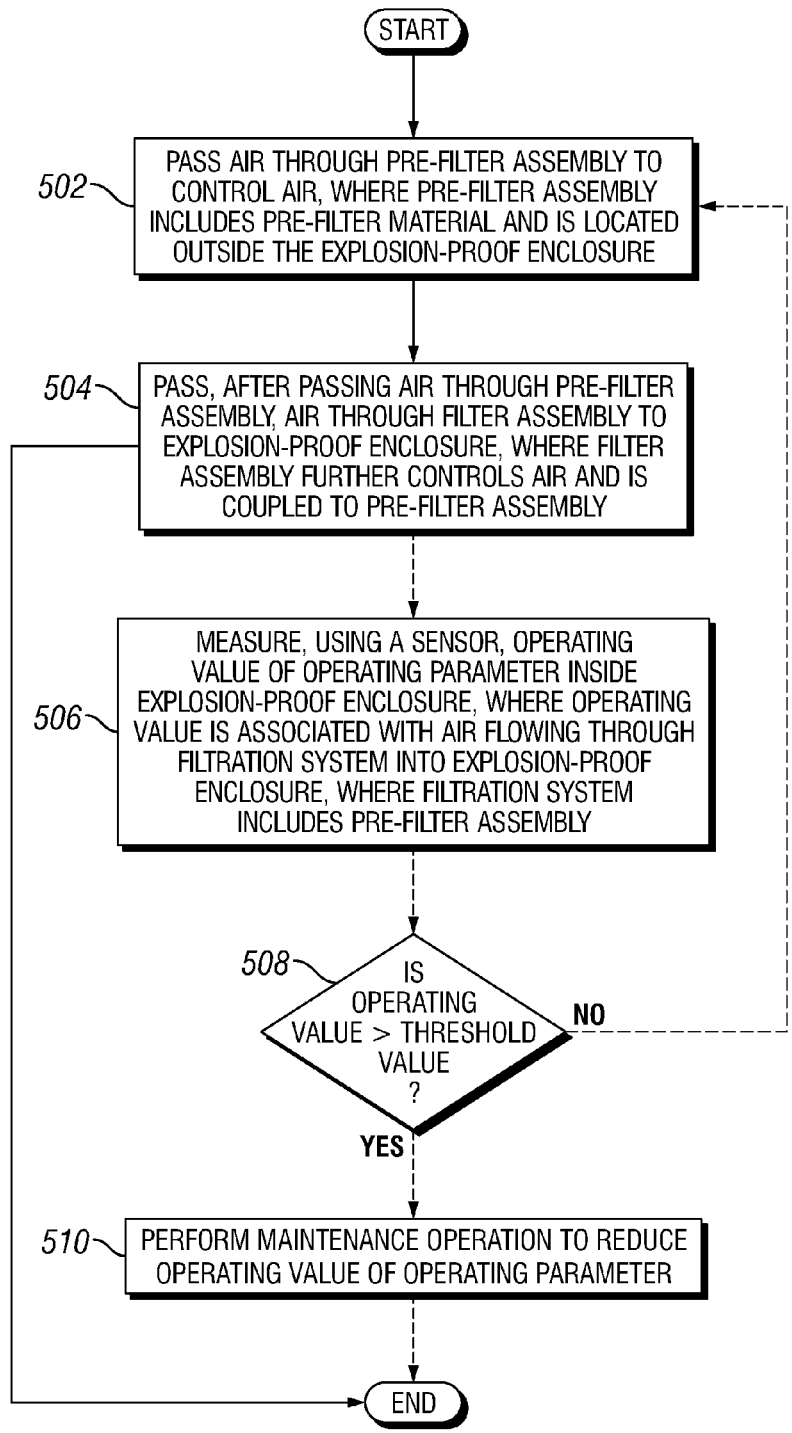
FIGS. 5A and 5B each show a flowchart of a method in accordance with one or more exemplary embodiments.
Figure 5B:
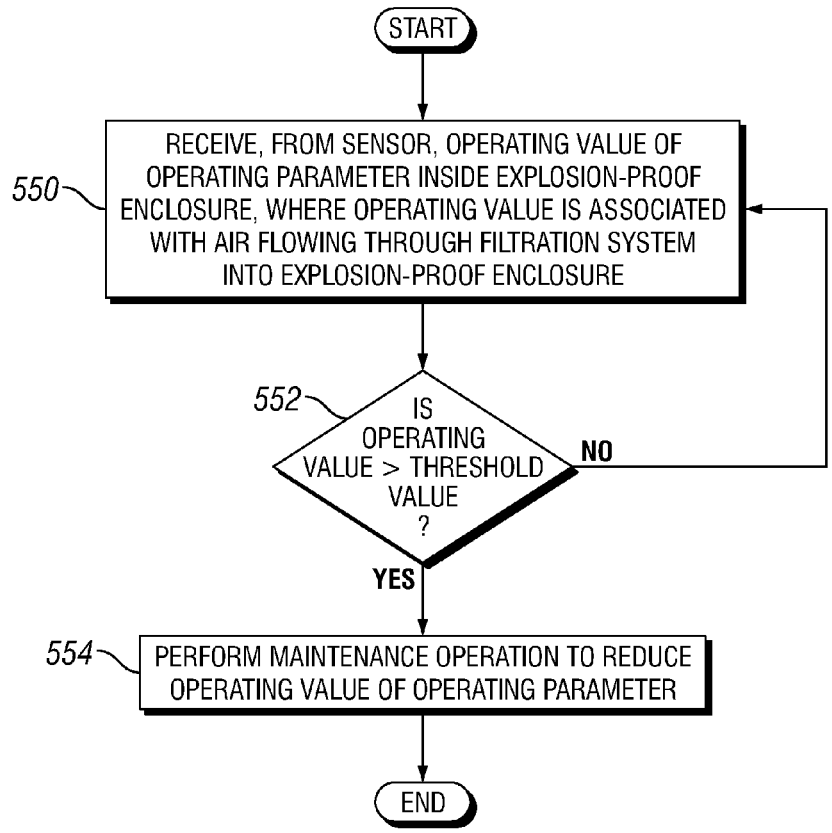

FIG. 5A shows a flowchart of a method for controlling air flowing into an explosion-proof enclosure in accordance with one or more embodiments. Further, FIG. 5B shows a flowchart of a method for sensing when maintenance for an explosion-proof enclosure is due in accordance with one or more embodiments. While the various steps in these flowcharts are presented and described sequentially, one of ordinary skill will appreciate that some or all of the steps may be executed in different orders, may be combined or omitted, and some or all of the steps may be executed in parallel. Further, in one or more of the embodiments of the invention, one or more of the steps described below may be omitted, repeated, and/or performed in a different order. In addition, a person of ordinary skill in the art will appreciate that additional steps, omitted in FIGS. 5A and 5B, may be included in performing this method. Accordingly, the specific arrangement of steps shown in FIGS. 5A and 5B should not be construed as limiting the scope of the invention.

Referring to FIG. 5A, in Step 502, air is passed through a pre-filter assembly to control the air. In one or more embodiments, the pre-filter assembly includes a pre-filter material and is located outside of the explosion-proof enclosure. The air received may be ambient air. The ambient air may be received in one of a number of ways, including but not limited to blowing (using, for example, a fan located outside the explosion-proof enclosure and bottom end of the pre-filter assembly) the air toward the pre-filter assembly, inducing air (using, for example, a fan located inside the explosion-proof enclosure and top end of the pre-filter assembly) the air through the pre-filter assembly, and inducing the air based on a pressure differential between the bottom end of the pre-filter assembly and the top end of the pre-filter assembly.

In Step 504, the air is passed, after the air is passed through the pre-filter assembly, through a filter assembly to the explosion-proof enclosure. In one or more embodiments of the invention, the filter assembly is coupled to the pre-filter assembly. When the air passes through the filter assembly, the air is controlled. The air may be controlled in one or more of a number of ways, including but not limited to containing a fire, suppressing a fire, removing dust and other particles from the air, removing moisture from the air, and/or cooling the air. The air may be controlled by a filter within the filter assembly. The filter may control the air based on one or more features of the filter, including but not limited to the thickness of the filter, the density of the filter, and the material used for the filter. After Step 504 is completed, the process may end.

Optionally, following Step 504, the process may proceed to Step 506. In Step 506, an operating value of an operating parameter is measured. The operating value may be measured using a sensor. In one or more embodiments, the operating parameter is inside the explosion-proof enclosure. The operating value may be associated with air flowing through a filtration system into the explosion-proof enclosure. The filtration system may include a pre-filter assembly and/or a filter assembly.

In Step 508, a determination is made as to whether the operating value exceeds a threshold value for the operating parameter. If more than one threshold value exists for the operating parameter, then the operating value is compared to the highest exceeded threshold value. If the operating value exceeds the threshold value, then the process proceeds to Step 510. If the operating value does not exceed the threshold value, then the process reverts to Step 502.

In Step 510, a maintenance operation is performed to reduce the operating value of the operating parameter. The maintenance operation may include one or more of a number of actions designed to reduce the operating value of the operating parameter. In addition, the maintenance operation performed may be based on the threshold value that was exceeded. As an example, if pressure at the pre-filter assembly is measured by a first sensor (e.g., a first pressure sensor) and pressure inside the explosion-proof enclosure is measured by a second sensor (e.g., a second pressure sensor), then an alert may be sent to a user when the difference between the pressures exceeds a threshold value. In such a case, the alert is the maintenance operation. In one or more embodiments of the invention, the alert may specify that maintenance of the pre-filter assembly is required and/or due.

As another example, if air flow, measured by a sensor (e.g., an air flow sensor), through a pre-filter assembly of the explosion-proof enclosure exceeds a threshold amount, then an alert may be sent to a user to notify the user that maintenance of the pre-filter assembly is required. As another example, if a temperature, measured by a sensor (e.g., a temperature sensor), within the explosion-proof enclosure exceeds a threshold amount, then an alert may be sent to a user to notify the user that maintenance of the pre-filter assembly is required.

Referring to FIG. 5B, in step 550, an operating value of an operating parameter is received from a sensor. In one or more embodiments, the operating parameter is inside the explosion-proof enclosure. The operating value may be associated with air flowing through the filtration system into the explosion-proof enclosure.

In Step 552, a determination is made as to whether the operating value exceeds a threshold value for the operating parameter. If more than one threshold value exists for the operating parameter, then the operating value is compared to the highest exceeded threshold value. If the operating value exceeds the threshold value, then the process proceeds to Step 554. If the operating value does not exceed the threshold value, then the process reverts to Step 550.

In Step 554, a maintenance operation is performed to reduce the operating value of the operating parameter. The maintenance operation may include one or more of a number of actions designed to reduce the operating value of the operating parameter. In addition, the maintenance operation performed may be based on the threshold value that was exceeded. As an example, when a temperature, air flow in an explosion-proof enclosure, and/or pressure differential inside the explosion-proof enclosure exceed a threshold value, a maintenance operation may include blowing air from inside the explosion-proof enclosure back through a filtration system (e.g., a filter assembly, a pre-filter assembly) using a reverse air flow mechanism (e.g., an air puffer device) located inside the explosion-proof enclosure. In such a case, the reverse air flow mechanism is configured to temporarily reverse the direction of the air flowing into the explosion-proof enclosure. Such a reverse of air flow may remove dirt, dust, and other materials that have accumulated on one or more filters of the filtration system (e.g., a filter of a filter assembly and/or a pre-filter material of a pre-filter assembly).

As another example, when a temperature, air flow in an explosion-proof enclosure, and/or pressure differential inside the explosion-proof enclosure exceed a threshold value, a maintenance operation may include vibrating the filtration system using a vibration mechanism (e.g., a vibration device) located proximate to a filtration system of an explosion-proof enclosure and configured to cause a controlled vibration of the filtration system.

As yet another example, when a temperature, air flow in an explosion-proof enclosure, and/or pressure differential inside the explosion-proof enclosure exceed a threshold value, a maintenance operation may include striking a portion of a filtration system using a mechanical arm (e.g., paddle and arm of a mechanical cleaning device) coupled to the explosion-proof enclosure. After Step 554 is completed, the process ends.

Figure 6:
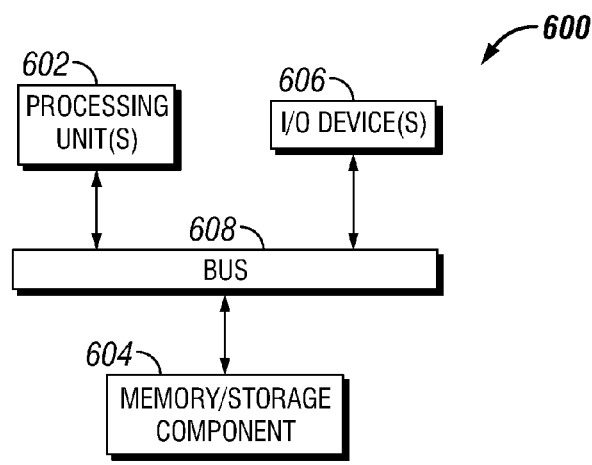
FIG. 6 shows a computing device in accordance with one or more exemplary embodiments.

FIG. 6 illustrates one embodiment of a computing device 600 that can implement one or more of the various techniques described herein, and which may be representative, in whole or in part, of the elements described herein. Computing device 600 is only one example of a computing device and is not intended to suggest any limitation as to scope of use or functionality of the computing device and/or its possible architectures. Neither should computing device 600 be interpreted as having any dependency or requirement relating to any one or combination of components illustrated in the example computing device 600.

Computing device 600 includes one or more processors or processing units 602, one or more memory/storage components 604, one or more input/output (I/O) devices 606, and a bus 608 that allows the various components and devices to communicate with one another. Bus 608 represents one or more of any of several types of bus structures, including a memory bus or memory controller, a peripheral bus, an accelerated graphics port, and a processor or local bus using any of a variety of bus architectures. Bus 608 can include wired and/or wireless buses.

Memory/storage component 604 represents one or more computer storage media. Memory/storage component 604 may include volatile media (such as random access memory (RAM)) and/or nonvolatile media (such as read only memory (ROM), flash memory, optical disks, magnetic disks, and so forth). Memory/storage component 604 can include fixed media (e.g., RAM, ROM, a fixed hard drive, etc.) as well as removable media (e.g., a Flash memory drive, a removable hard drive, an optical disk, and so forth).

One or more I/O devices 606 allow a customer, utility, or other user to enter commands and information to computing device 600, and also allow information to be presented to the customer, utility, or other user and/or other components or devices. Examples of input devices include, but are not limited to, a keyboard, a cursor control device (e.g., a mouse), a microphone, and a scanner. Examples of output devices include, but are not limited to, a display device (e.g., a monitor or projector), speakers, a printer, and a network card.

Various techniques may be described herein in the general context of software or program modules. Generally, software includes routines, programs, objects, components, data structures, and so forth that perform particular tasks or implement particular abstract data types. An implementation of these modules and techniques may be stored on or transmitted across some form of computer readable media. Computer readable media may be any available non-transitory medium or non-transitory media that can be accessed by a computing device. By way of example, and not limitation, computer readable media may comprise "computer storage media".

"Computer storage media" and "computer readable medium" include volatile and non-volatile, removable and non-removable media implemented in any method or technology for storage of information such as computer readable instructions, data structures, program modules, or other data. Computer storage media include, but are not limited to, computer recordable media such as RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

The computer device 600 may be connected to a network (not shown) (e.g., a local area network (LAN), a wide area network (WAN) such as the Internet, or any other similar type of network) via a network interface connection (not shown). Those skilled in the art will appreciate that many different types of computer systems exist (e.g., desktop computer, a laptop computer, a personal media device, a mobile device, such as a cell phone or personal digital assistant, or any other computing system capable of executing computer readable instructions), and the aforementioned input and output means may take other forms, now known or later developed. Generally speaking, the computer system 600 includes at least the minimal processing, input, and/or output means necessary to practice one or more embodiments.

Further, those skilled in the art will appreciate that one or more elements of the aforementioned computer device 600 may be located at a remote location and connected to the other elements over a network. Further, one or more embodiments may be implemented on a distributed system having a plurality of nodes, where each portion of the implementation (e.g., controller 115, energy source 120) may be located on a different node within the distributed system. In one or more embodiments, the node corresponds to a computer system. Alternatively, the node may correspond to a processor with associated physical memory. The node may alternatively correspond to a processor with shared memory and/or resources.

The following description (in conjunction with FIGS. 1 through 6) describes a few examples in accordance with one or more embodiments. The examples are for explanatory purposes only and is not intended to limit the scope of pre-filtration and maintenance sensing for explosion-proof enclosures. Terminology used in FIGS. 1 through 6 may be used in the example without further reference to FIGS. 1 through 6.

Example 1

Consider the following example, shown in FIGS. 7A and 7B, which describes pre-filtration for an explosion-proof enclosure 701 in accordance with one or more embodiments described above. In FIG. 7A, a cross-sectional side view of a filter system for an explosion-proof enclosure 701 is shown. The filter system of FIG. 7A is completely clean and is about to be put into service for the explosion-proof enclosure 701. The filter system shown in FIG. 7A includes a pre-filter assembly and a filter assembly.

The pre-filter assembly includes a base 724, a reinforcement structure 722, and pre-filter material 720. The base 724 of the pre-filter assembly includes mating threads 718 along the inner wall of the base 724, where the mating threads are used to couple the pre-filter assembly to the filter assembly. The base 724 extends into the reinforcement structure 722, which includes a number of vertical elements to provide support for the pre-filter material 720. Specifically, the reinforcement structure 722 is configured to prevent the pre-filter material 720 from collapsing onto the filter assembly as inlet air 728 is drawn inside the explosion-proof enclosure through the pre-filter assembly and the filter assembly. In this example, the pre-filter material 720 is coupled to the base 724 of the pre-filter assembly using Velcro (not shown).

The filter assembly includes a filter body 710 and a filter 716. The filter body 710 has mating threads 718 on the outer surface to couple the filter assembly to the explosion-proof enclosure wall 702 through a threaded aperture in the explosion-proof enclosure wall 702. The mating threads 718 of the filter body 710 are also used to couple the filter assembly to the base 724 of the pre-filter assembly, as described above. A cavity 712 is located inside the filter body 710 and meets with the filter 716, which is also located inside the filter body 710. In this example, the filter 716 is coupled to the filter body 710 using welding 714. In this example, the filter 716 has a significantly smaller surface area compared to the surface area of the pre-filter material 720.

The inlet air 728 includes debris 730 and is being directed toward the filter system. Debris may include, but is not limited to, dirt, dust, moisture, and heat. The filter system is configured to reduce the amount of debris 730 in the inlet air 728 before the inlet air 728 enters the interior of the explosion-proof enclosure 701.

In FIG. 7B, the filter system has been in service for a period of time during operation of the explosion-proof enclosure 701. As a result, debris layer 1 732 has accumulated on the pre-filter material 720. In addition, debris layer 2 734 has accumulated on the filter 716. Due in part to the larger surface area of the pre-filter material 720, debris layer 2 734 is significantly larger than debris layer 1 732. In one or more embodiments, debris layer 1 732 may be reduced or removed from the pre-filter material 720 without interrupting the operation of the equipment inside the explosion-proof enclosure 701.

Example 2

Figure 8A:
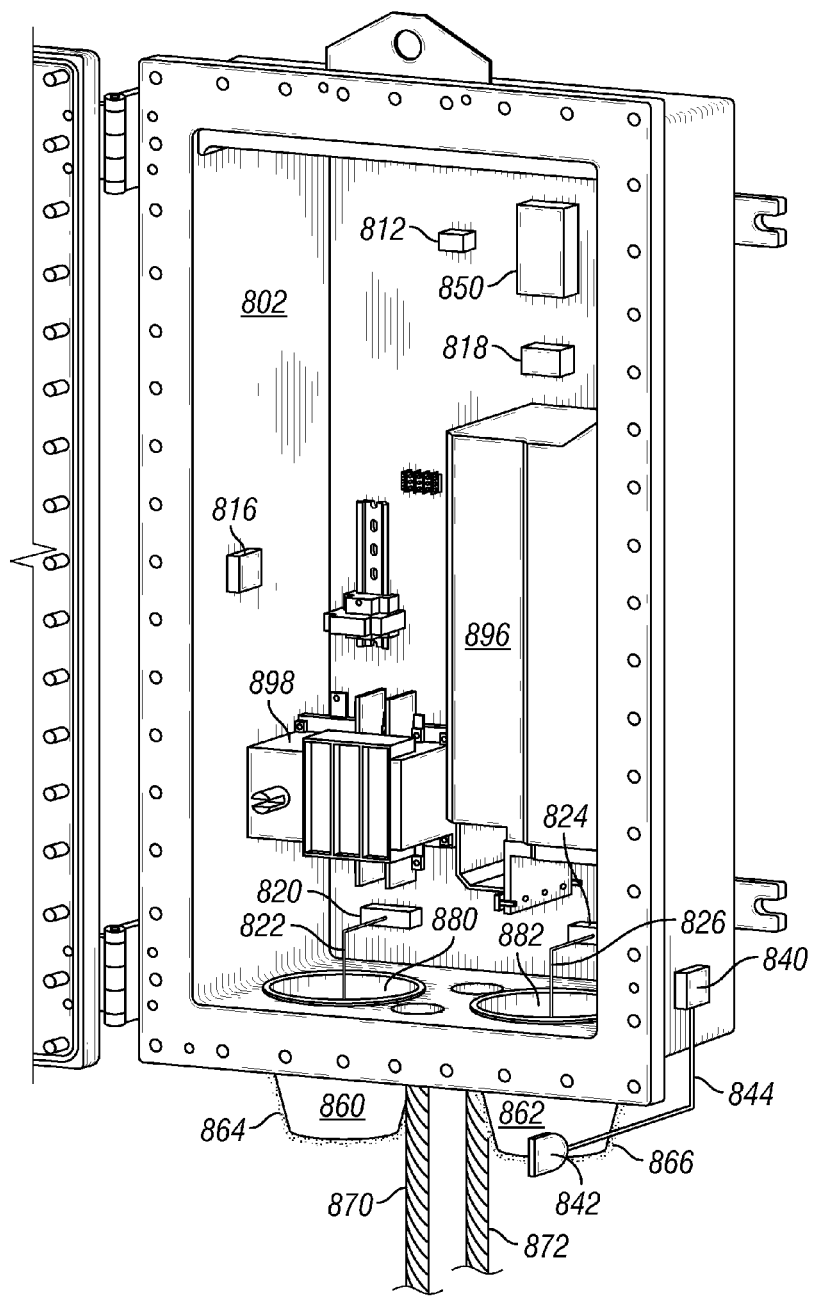
FIG. 8A shows an explosion-proof enclosure in accordance with an exemplary embodiment.

Consider the following example, shown in FIGS. 8A through 8F, which describes maintenance sensing for an explosion-proof enclosure 802 in accordance with one or more embodiments described above. FIG. 8A shows a number of elements inside and/or adjacent to the explosion-proof enclosure 802. The elements include, similar to those described above with respect to FIG. 4, pressure sensor 2 812, temperature sensor 816, airflow sensor 818, air puffer device 1 820, air puffer device 2 824, mechanical cleaning device 840, and control device 850. The mechanical cleaning device 840 is coupled to a paddle 842 by an arm 844. In addition, air puffer line 1 822 extends from air puffer device 1 820 through aperture 1 880 toward the filter system. Similarly, air puffer line 2 826 extends from air puffer device 2 824 through aperture 2 882 toward the filter system. Further included in the explosion-proof enclosure 802 of FIG. 8A are a VFD 896 and a switch 898 used to control power to one or more elements in the explosion-proof enclosure 802.

In addition, pre-filter material 1 860 (part of pre-filter assembly 1) and pre-filter material 2 862 are shown coupled to the bottom outer wall of the explosion-proof enclosure 802. Debris layer 1 880 has accumulated on pre-filter material 1 860, and debris layer 2 882 has accumulated on pre-filter material 2 862. Conduit 1 870 and conduit 2 872 are coupled to the bottom outer wall of the explosion-proof enclosure 802 and are configured to convey cable for power, instrumentation, controls, grounding, communication, and/or any other suitable operation for one or more elements within the explosion-proof enclosure 802. Absent from view in FIG. 8A are pressure sensor 1 810 (located underneath pre-filter material 1 860) and the vibration device 830, which is affixed to the base of pre-filter assemblies 1 and 2.

Figure 8B:
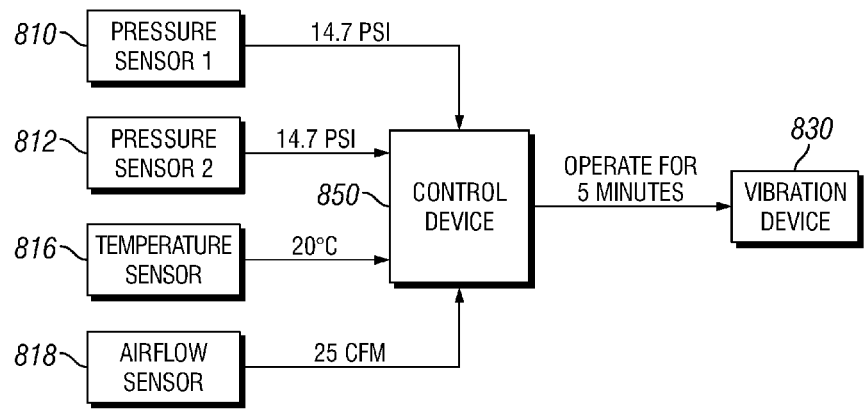
FIGS. 8B through 8F show an example of a control device in accordance with one or more exemplary embodiments.

FIG. 8B shows the control device 850 receiving signals from the sensors (i.e., pressure sensor 1 810, pressure sensor 2 812, the temperature sensor 816, and the airflow sensor 818). Specifically, pressure sensor 1 810 measures and sends an operating value of 14.7 psi to the control device 850; pressure sensor 2 812 measures and sends an operating value of 14.7 psi to the control device 850; the temperature sensor 816 measures and sends an operating value of 20° C. to the control device 850; and the airflow sensor 818 measures and sends an operating value of 25 cubic feet per minute (cfm) to the control device 850.

Based on the operating values sent by the sensors and using one or more algorithms, the control device 850 determines that a slight accumulation of debris has formed on the pre-filter material. Specifically, a small amount of debris layer 1 864 has accumulated on pre-filter material 1 860, and a small amount of debris layer 2 866 has accumulated on pre-filter material 2 862. The control device 850 further determines, based on the operating values and using an algorithm, that a maintenance operation should be performed. Specifically, the vibration device 830 should be used for five minutes to attempt removing at least some of debris layer 1 864 and debris layer 2 866 from pre-filter material 1 860 and pre-filter material 2 862, respectively. The control device 850 sends a signal to the vibration device 830 to turn on for five minutes. After five minutes, the control device 850 may send a second signal to the vibration device 830 to cease operating. Alternatively, the vibration device 830 may automatically stop after five minutes of operation based on the original signal from the control device 850.

Figure 8C:
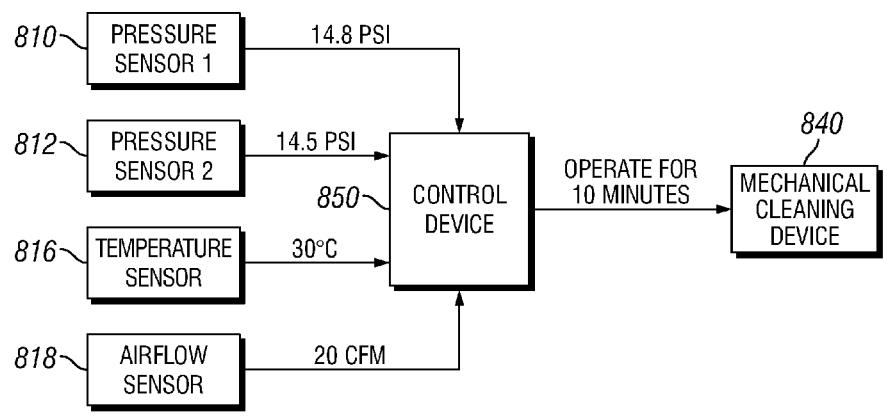

At some point later in time, as shown in FIG. 8C, the control device 850 receives additional signals from the sensors. Specifically, pressure sensor 1 810 measures and sends an operating value of 14.8 psi to the control device 850; pressure sensor 2 812 measures and sends an operating value of 14.5 psi to the control device 850; the temperature sensor 816 measures and sends an operating value of 30° C. to the control device 850; and the airflow sensor 818 measures and sends an operating value of 20 cfm to the control device 850.

Based on the operating values sent by the sensors and using the algorithm(s), the control device 850 determines that the accumulation of debris that has formed on the pre-filter material has increased slightly since the action taken in FIG. 8B. Specifically, an increased amount of debris layer 1 864 has accumulated on pre-filter material 1 860, and an increased amount of debris layer 2 866 has accumulated on pre-filter material 2 862. The control device 850 further determines, based on the operating values and using the algorithm, that a different maintenance operation should be performed. Specifically, the mechanical cleaning device 840 should be used for 10 minutes to attempt removing at least some of debris layer 1 864 and debris layer 2 866 from pre-filter material 1 860 and pre-filter material 2 862, respectively. The control device 850 sends a signal to the mechanical cleaning device 840 to turn on for 10 minutes. After 10 minutes, the control device 850 may send a second signal to the mechanical cleaning device 840 to cease operating. Alternatively, the mechanical cleaning device 840 may automatically stop after 10 minutes of operation based on the original signal from the control device 850.

Figure 8D:
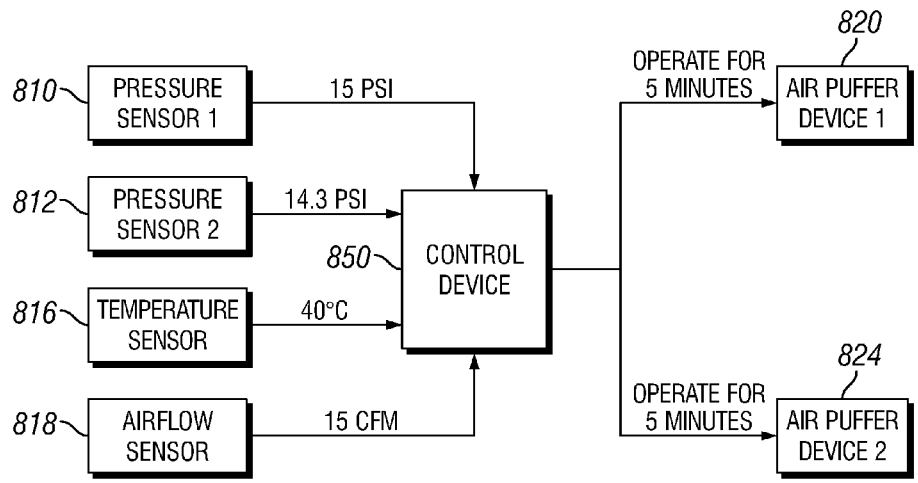

At some point later in time, as shown in FIG. 8D, the control device 850 receives additional signals from the sensors. Specifically, pressure sensor 1 810 measures and sends an operating value of 15 psi to the control device 850; pressure sensor 2 812 measures and sends an operating value of 14.3 psi to the control device 850; the temperature sensor 816 measures and sends an operating value of 40° C. to the control device 850; and the airflow sensor 818 measures and sends an operating value of 15 cfm to the control device 850.

Based on the operating values sent by the sensors and using the algorithm(s), the control device 850 determines that the accumulation of debris that has formed on the pre-filter material has increased further since the action taken in FIG. 8C. Specifically, an increased amount of debris layer 1 864 has accumulated on pre-filter material 1 860, and an increased amount of debris layer 2 866 has accumulated on pre-filter material 2 862. The control device 850 further determines, based on the operating values and using the algorithm, that a different maintenance operation should be performed. Specifically, the air puffer devices (i.e., air puffer device 1 820, air puffer device 2 822) should be used for 5 minutes to attempt removing at least some of debris layer 1 864 and debris layer 2 866 from pre-filter material 1 860 and pre-filter material 2 862, respectively. The control device 850 sends a signal to the air puffer device 1 820 and air puffer device 2 822 to turn on for 5 minutes. After 5 minutes, the control device 850 may send a second signal to air puffer device 1 820 and air puffer device 2 822 to cease operating. Alternatively, air puffer device 1 820 and air puffer device 2 822 may automatically stop after 5 minutes of operation based on the original signal from the control device 850.

Figure 8E:
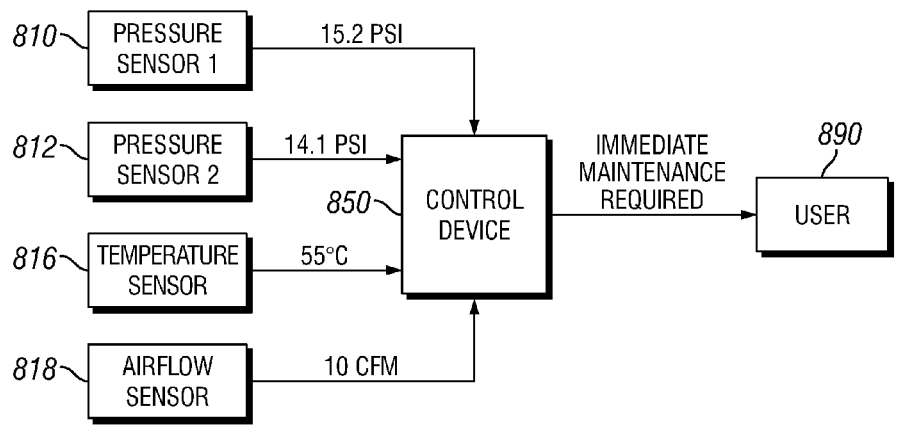

At some point later in time, as shown in FIG. 8E, the control device 850 receives additional signals from the sensors. Specifically, pressure sensor 1 810 measures and sends an operating value of 15.2 psi to the control device 850; pressure sensor 2 812 measures and sends an operating value of 14.1 psi to the control device 850; the temperature sensor 816 measures and sends an operating value of 55° C. to the control device 850; and the airflow sensor 818 measures and sends an operating value of 10 cfm to the control device 850.

Based on the operating values sent by the sensors and using the algorithm(s), the control device 850 determines that the accumulation of debris that has formed on the pre-filter material has increased even further since the action taken in FIG. 8D. Specifically, a significant amount of debris layer 1 864 has accumulated on pre-filter material 1 860, and a significant amount of debris layer 2 866 has accumulated on pre-filter material 2 862. The control device 850 further determines, based on the operating values and using the algorithm, that a different maintenance operation should be performed. Specifically, a notification is sent to a user 890 to notify the user that immediate maintenance of the filter system is required and/or due. For example, the notification may be a signal sent to a control panel in a control room so that a control room operator (e.g., user) can become aware of the problem and dispatch a maintenance worker to resolve the problem (e.g., clean the debris from the pre-filter material). The notification may be sent continuously until the problem is resolved (i.e., the pressure differential, temperature, and/or airflow rate are brought to within normal operating levels).

Figure 8F:
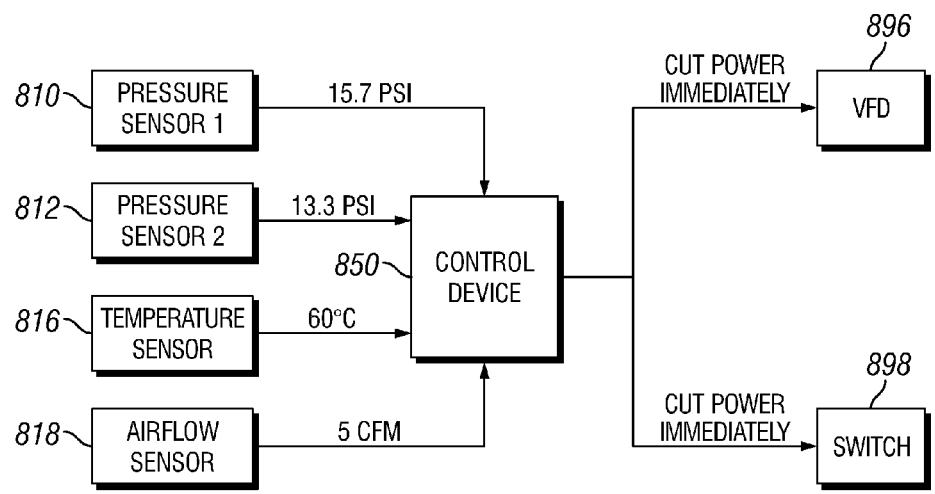

At some point later in time, as shown in FIG. 8F, the control device 850 receives additional signals from the sensors. Specifically, pressure sensor 1 810 measures and sends an operating value of 15.7 psi to the control device 850; pressure sensor 2 812 measures and sends an operating value of 13.3 psi to the control device 850; the temperature sensor 816 measures and sends an operating value of 60° C. to the control device 850; and the airflow sensor 818 measures and sends an operating value of 5 cfm to the control device 850.

Based on the operating values sent by the sensors and using the algorithm(s), the control device 850 determines that the accumulation of debris that has formed on the pre-filter material has increased even further since the action taken in FIG. 8E. Specifically, a dangerously high amount of debris layer 1 864 has accumulated on pre-filter material 1 860, and a dangerously high amount of debris layer 2 866 has accumulated on pre-filter material 2 862. The control device 850 further determines, based on the operating values and using the algorithm, that a different maintenance operation should be performed. Specifically, power to the VFD 896 and the switch 898 are cut immediately. Because the problem was not corrected in response to the notification described above with respect to FIG. 8E, the notification may continue to be sent continuously until the problem is resolved (i.e., the pressure differential, temperature, and/or airflow rate are brought to within normal operating levels after the pre-filter material is cleared of debris and the operations of the elements within the explosion-proof enclosure have resumed).

One or more embodiments provide for pre-filtration and maintenance sensing for an explosion-proof enclosure. Specifically, one or more embodiments are configured to use a pre-filter assembly to pre-filter air drawn into an explosion-proof enclosure. By using a pre-filter assembly, less maintenance may be performed on the filter assembly, which receives intake air from the pre-filter assembly and passes the intake air to the interior of the explosion-proof enclosure.

Further, one or more embodiments are configured to use one or more sensors to detect when maintenance is required and/or due for one or more elements of the explosion-proof enclosure. Specifically, a control device may be configured to communicate with the sensors to receive one or more operating values of one or more operating parameters. The operating parameters may be associated with the air flowing into the explosion-proof enclosure. The control device may also be configured to perform a maintenance operation using one or more devices. In one or more embodiments, the maintenance operation relates to removing debris from the pre-filter material of a pre-filter assembly.

Although pre-filtration and maintenance sensing for an explosion-proof enclosure are described with reference to preferred embodiments, it should be appreciated by those skilled in the art that various modifications are well within the scope of pre-filtration and maintenance sensing for an explosion-proof enclosure. From the foregoing, it will be appreciated that an embodiment of pre-filtration and maintenance sensing for an explosion-proof enclosure overcomes the limitations of the prior art. Those skilled in the art will appreciate that pre-filtration and maintenance sensing for an explosion-proof enclosure is not limited to any specifically discussed application and that the embodiments described herein are illustrative and not restrictive. From the description of the exemplary embodiments, equivalents of the elements shown therein will suggest themselves to those skilled in the art, and ways of constructing other embodiments of pre-filtration and maintenance sensing for an explosion-proof enclosure will suggest themselves to practitioners of the art. Therefore, the scope of pre-filtration and maintenance sensing for an explosion-proof enclosure is not limited herein.

What is claimed is:

1. A maintenance sensing system for an enclosure, the maintenance sensing system comprising:
    a filter system located in an aperture in a wall of the enclosure, wherein the filter system controls air flowing into the enclosure, wherein the enclosure is suitable for explosive environments, and wherein the filter system comprises at least one enclosure coupling feature that couples to the wall of the enclosure so that the enclosure complies with industry standards for explosion-proof enclosures;
    a sensor that measures an operating value of an operating parameter inside the enclosure, wherein the operating value is associated with the air flowing into the enclosure through the filter system;
    a control device operatively coupled to the sensor, wherein the control device:
        receives the operating value from the sensor;
        determines that the operating value exceeds a threshold value; and
        performs, based on determining that the operating value exceeds a threshold value, a maintenance operation to reduce the operating value of the operating parameter inside the enclosure.

2. The maintenance sensing system of claim 1, wherein the maintenance operation comprises sending an alert to a user that maintenance of the filter system is required.

3. The maintenance sensing system of claim 1, further comprising:
    a reverse air flow mechanism located within the enclosure, wherein the reverse air flow mechanism reverses a direction of the air flowing into the enclosure, wherein the maintenance operation comprises blowing the air from inside the enclosure back through the filter system using the reverse air flow mechanism.

4. The maintenance sensing system of claim 1, further comprising:
a vibration mechanism located proximate to the filter system, wherein the vibration mechanism generates a controlled vibration that is applied to the filter system,
wherein the maintenance operation comprises vibrating the filter system using the vibration mechanism.

5. The maintenance sensing system of claim 1, further comprising:
a paddle of a mechanical cleaning device coupled to the enclosure,
wherein the paddle strikes a portion of the filter system, and
wherein the maintenance operation comprises striking the portion of the filter system using a mechanical arm that directs the paddle.

6. The maintenance sensing system of claim 1, wherein the filter system comprises:
a filter assembly coupled to the explosion-proof enclosure and covering the aperture in the explosion-proof enclosure; and
a pre-filter assembly located outside the explosion-proof enclosure and covering the filter assembly and the aperture in the explosion-proof enclosure.

7. The maintenance sensing system of claim 6, wherein the maintenance operation comprises sending an alert to a user that maintenance of the filter assembly is required.

8. The maintenance sensing system of claim 6, wherein the maintenance operation comprises sending an alert to a user that maintenance of the pre-filter assembly is required.

9. The maintenance sensing system of claim 6, wherein the maintenance operation comprises blowing the air from inside the explosion-proof enclosure through the filter assembly and the pre-filter assembly using a reverse air flow mechanism.

10. The maintenance sensing system of claim 6, wherein the reverse air flow mechanism is positioned inside the explosion-proof enclosure.

11. The maintenance sensing system of claim 6, wherein the pre-filter assembly comprises a reinforcement structure and a pre-filter material disposed over the reinforcement structure, wherein the pre-filter material controls air passing therethrough.

12. The maintenance sensing system of claim 11, wherein the maintenance operation comprises vibrating the reinforcement structure of the pre-filter assembly using a vibration mechanism.

13. The maintenance sensing system of claim 11, wherein the maintenance operation comprises striking the pre-filter material of the pre-filter system using a paddle directed by a mechanical arm.

14. The maintenance sensing system of claim 13, wherein the paddle is located inside the explosion-proof enclosure.

15. The maintenance sensing system of claim 1, wherein the operating parameter is a temperature, wherein the sensor comprises a temperature measuring device.

16. The maintenance sensing system of claim 1, wherein the operating parameter is a pressure differential, wherein the sensor comprises a first pressure measuring device and a second pressure measuring device.

17. The maintenance sensing system of claim 16, wherein the filter system comprises:
a filter assembly coupled to the explosion-proof enclosure and covering the aperture in the explosion-proof enclosure; and
a pre-filter assembly located outside the explosion-proof enclosure and covering the filter assembly and the aperture in the explosion-proof enclosure,
wherein the first pressure measuring device measures a first pressure at the pre-filter assembly, and wherein the second pressure measuring device measures a second pressure inside the explosion-proof enclosure.

18. The maintenance sensing system of claim 1, wherein the operating parameter is air flow, wherein the sensor comprises an air flow measuring device.

19. An explosion-proof enclosure, comprising:
an enclosure body having an aperture that traverses therethrough;
an enclosure cover coupled to the enclosure body;
a filter system located in the aperture of the explosion-proof enclosure, wherein the filter system controls air flowing into the explosion-proof enclosure, and wherein the filter system comprises at least one enclosure coupling feature that couples to the explosion-proof enclosure so that the explosion-proof enclosure complies with industry standards for explosion-proof enclosures;
a sensor that measures an operating value of an operating parameter inside the explosion-proof enclosure, wherein the operating value is associated with the air flowing into the explosion-proof enclosure through the filter system; and
a control device operatively coupled to the sensor, wherein the control device:
receives the operating value from the sensor;
determines that the operating value exceeds a threshold value; and
performs, based on determining that the operating value exceeds a threshold value, a maintenance operation to reduce the operating value of the operating parameter inside the explosion-proof enclosure.

20. The explosion-proof enclosure of claim 19, wherein the filter system comprises:
a filter assembly coupled to the explosion-proof enclosure and covering the aperture in the explosion-proof enclosure; and
a pre-filter assembly located outside the explosion-proof enclosure and covering the filter assembly and the aperture in the explosion-proof enclosure.

* * * * *